(12) United States Patent
Kawashita et al.

(10) Patent No.: US 12,222,530 B2
(45) Date of Patent: Feb. 11, 2025

(54) WAVELENGTH SELECTIVE FILTER, DISPLAY, OPTICAL DEVICE, AND METHOD OF PRODUCING WAVELENGTH SELECTIVE FILTER

(71) Applicant: TOPPAN INC., Tokyo (JP)

(72) Inventors: Masashi Kawashita, Tokyo (JP); Yukari Oda, Tokyo (JP)

(73) Assignee: TOPPAN INC., Tokyo (JP)

( * ) Notice: Subject to any disclaimer, the term of this patent is extended or adjusted under 35 U.S.C. 154(b) by 537 days.

(21) Appl. No.: 17/557,917

(22) Filed: Dec. 21, 2021

(65) Prior Publication Data
US 2022/0113458 A1 Apr. 14, 2022

Related U.S. Application Data

(63) Continuation of application No. PCT/JP2020/025397, filed on Jun. 26, 2020.

(30) Foreign Application Priority Data

Jun. 27, 2019 (JP) .................................. 2019-120103
Jun. 27, 2019 (JP) .................................. 2019-120104

(51) Int. Cl.
*G02B 5/26* (2006.01)
*H01L 27/146* (2006.01)

(52) U.S. Cl.
CPC ............ *G02B 5/26* (2013.01); *H01L 27/1462* (2013.01)

(58) Field of Classification Search
CPC ........ G02B 5/26; G02B 5/1809; G02B 5/203; G02B 5/18; G02B 5/28; H01L 27/1462; H01L 27/14621
See application file for complete search history.

(56) References Cited

U.S. PATENT DOCUMENTS

2010/0244168 A1 9/2010 Shiozawa et al.
2013/0093034 A1 4/2013 Kokubun et al.
(Continued)

FOREIGN PATENT DOCUMENTS

JP 2009-25558 2/2009
JP 2010-225944 A 10/2010
(Continued)

OTHER PUBLICATIONS

Extended European Search Report issued in connection with EP Appl. Ser. No. 20831097.9 dated Jul. 11, 2022 (8 pages).
(Continued)

*Primary Examiner* — Ryan D Howard
(74) *Attorney, Agent, or Firm* — Foley & Lardner LLP

(57) ABSTRACT

An optical device including a concavo-convex structure layer composed of a plurality of protrusions arranged having a subwavelength period; a high refractive index layer located on the concavo-convex structure and having a surface shape following the concavo-convex structure; and a low refractive index layer located on the high refractive index layer and having a surface shape following a concavo-convex structure on a surface of the high refractive index layer. The high refractive index layer includes a first grating high refractive index region located on a bottom of the concavo-convex structure to form a subwavelength grating, and a second grating high refractive index region located on a top of the concavo-convex structure to form a subwavelength grating. The high refractive index layer has a refractive index higher than both the refractive indices of the concavo-convex structure layer and the low refractive index layer.

12 Claims, 13 Drawing Sheets

(56) References Cited

U.S. PATENT DOCUMENTS

2018/0143358 A1* 5/2018 Kawashita ........... G02B 5/1809
2019/0103425 A1 4/2019 Yoon et al.
2019/0333418 A1 10/2019 Kawashita
2020/0357834 A1 11/2020 Yoon et al.

FOREIGN PATENT DOCUMENTS

| | | |
|---|---|---|
| JP | 5023324 B2 | 9/2012 |
| JP | 2013-088557 A | 5/2013 |
| JP | 2018-111253 A | 7/2018 |
| JP | 2019-068049 A | 4/2019 |
| WO | WO 2018/070431 A1 | 1/2016 |
| WO | WO-2019/004229 A1 | 1/2019 |

OTHER PUBLICATIONS

International Searching Authority, "International Search Report," issued in connection with International Patent Application No. PCT/JP2020/025397, dated Sep. 1, 2020, 5 pages.

International Searching Authority, "Written Opinion," issued in connection with International Patent Application No. PCT/JP2020/025397, dated Sep. 1, 2020, 4 pages.

Office Action issued in corresponding Japanese Patent Application No. 2019-120104, dated May 9, 2023.

Office Action issued in corresponding Japanese Patent Application No. 2019-120103 dated Oct. 3, 2023 (5 pages).

\* cited by examiner

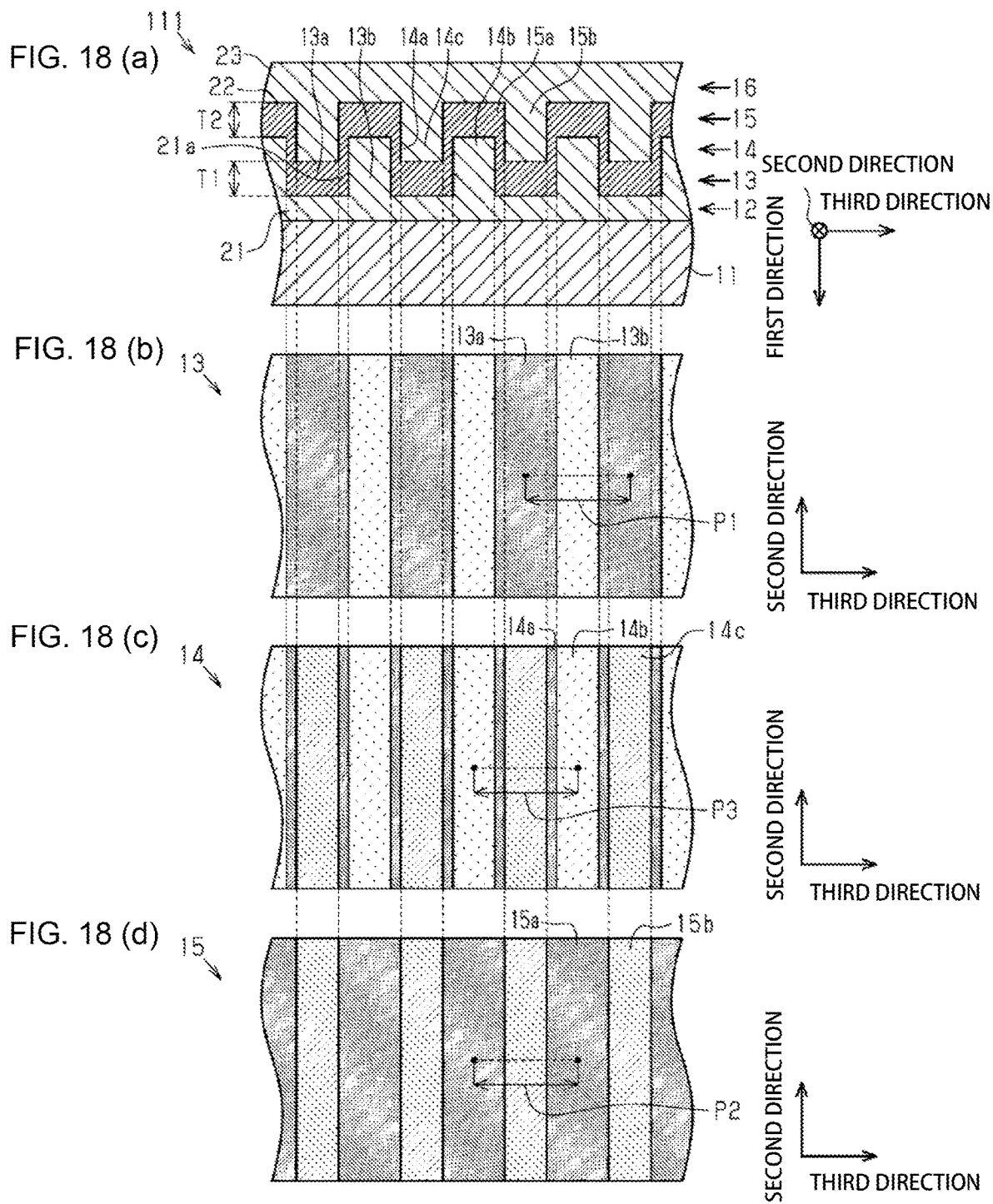

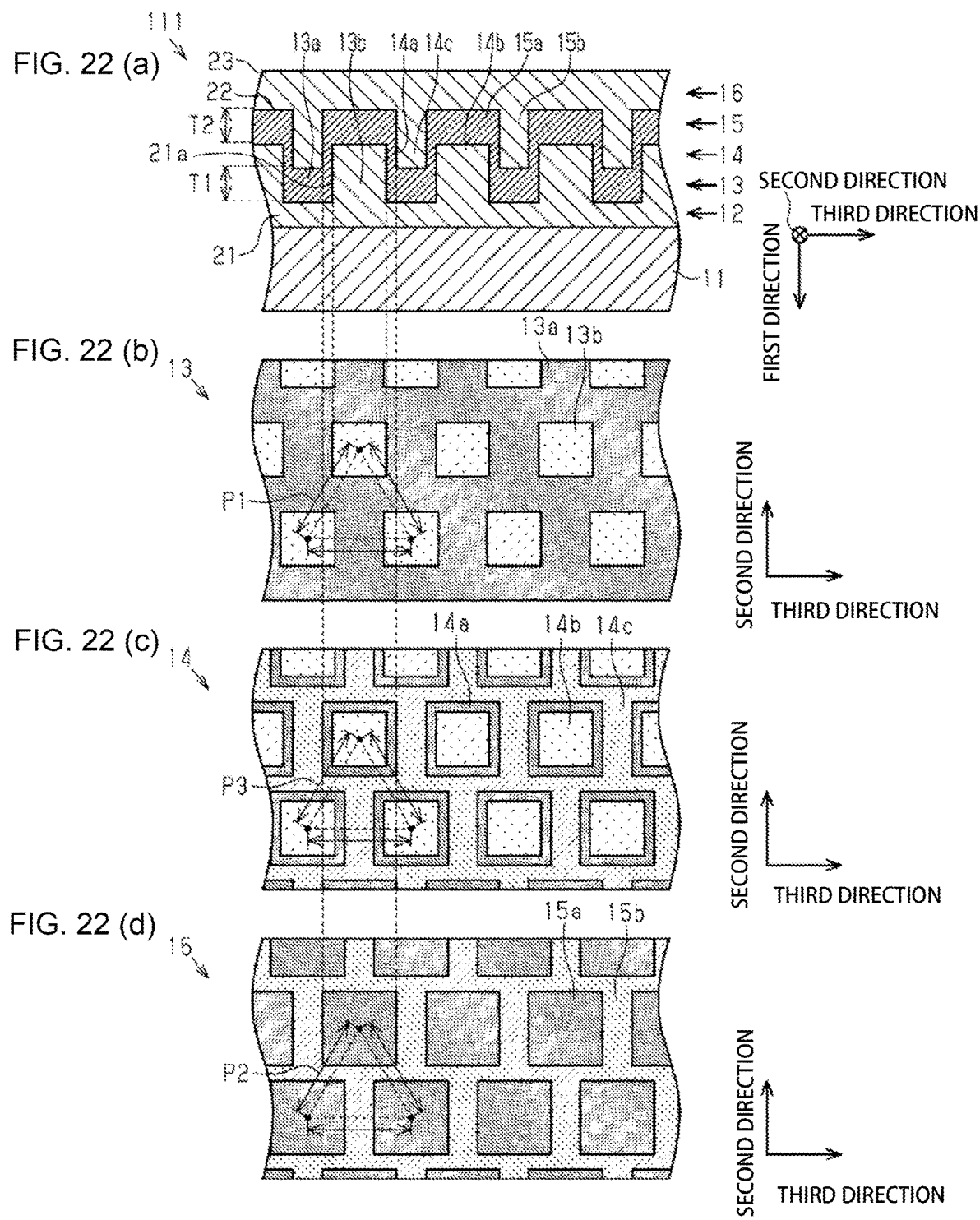

WAVELENGTH SELECTIVE FILTER, DISPLAY, OPTICAL DEVICE, AND METHOD OF PRODUCING WAVELENGTH SELECTIVE FILTER

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/025397, filed on Jun. 26, 2020, which is based upon and claims the benefit of priority to Japanese Patent Application No. 2019-120103, filed on Jun. 27, 2019 and Japanese Patent Application No. 2019-120104, filed on Jun. 27, 2019; the disclosures of which are incorporated herein by reference in their entireties.

TECHNICAL FIELD

Embodiments of the present disclosure relate to a wavelength selective filter using a guided-mode resonance phenomenon, a display, an optical device, and a method of producing the wavelength selective filter.

BACKGROUND

Wavelength selective filters using a guided-mode resonance phenomenon have been proposed as filters for selecting light by using an optical phenomenon caused by a fine structure of an object. The wavelength selective filter has a subwavelength grating, which is a diffraction grating with a period smaller than the wavelength of light. When light is incident on the subwavelength grating, light in a specific wavelength range propagates with multiple reflections due to a difference in refractive index between a region where the subwavelength grating is located and a peripheral region thereof, causing resonance at which reflected light is strongly emitted, while diffracted light is prevented from being emitted into a space through which the incident light has travelled.

For example, a color filter described in PTL 1 has a structure in which a plurality of protrusions constituting a subwavelength grating are disposed on a substrate. As described in PTL 1, it is desired to fabricate the substrate and the protrusions from synthetic quartz and silicon, respectively, to ensure a large difference in refractive index between the substrate and the protrusions to thereby minimize loss occurring in multiple reflections of light in order to increase the intensity of light extracted from such a structure. This requires the use of an SOQ (silicon on quartz) substrate in which single-crystal silicon is formed on a substrate made of synthetic quartz, which causes an increase in the manufacturing cost.

On the other hand, a wavelength selective element described in PTL 2 has a waveguide layer between a substrate and protrusions constituting a subwavelength grating, the waveguide layer being made of a material having a refractive index higher than that of a material forming the substrate. According to this structure, the intensity of reflected light can be increased even when the protrusions and the waveguide layer are made of a resin since the light propagates with multiple reflections in the waveguide layer. Further, since the protrusions and the waveguide layer made of a resin can be fabricated by nanoimprinting, production can be simplified while reducing the material costs, and thus the production cost can also be reduced.

CITATION LIST

Patent Literature

PTL 1: JP 5023324 B; PTL 2: JP 2009-25558 A.

SUMMARY OF THE INVENTION

Problem to be Solved by the Invention

In order to increase the wavelength selectivity of a wavelength selective filter using a guided-mode resonance phenomenon, it is desired to increase the intensity of reflected light due to the guided-mode resonance phenomenon. In addition, it is also desired to prevent light in a wavelength range different from that of reflected light due to the guided-mode resonance phenomenon from being emitted together with the reflected light. From this point of view, there is still room for improvement in the structure for enhancing the wavelength selectivity of the wavelength selective filter using a guided-mode resonance phenomenon.

Embodiments of the present disclosure aim to provide a wavelength selective filter having improved wavelength selectivity, a display, an optical device, and a method of producing the wavelength selective filter.

Solution to Problem

A wavelength selective filter for solving the above problem includes: a concavo-convex structure layer having a concavo-convex structure on a surface, the concavo-convex structure being composed of a plurality of concavo-convex elements arranged having a subwavelength period, the concavo-convex elements including protrusions and recesses; a high refractive index layer located on the concavo-convex structure and having a surface shape following the concavo-convex structure, the high refractive index layer including a first grating high refractive index region located on a bottom of the concavo-convex structure to form a subwavelength grating, and a second grating high refractive index region located on a top of the concavo-convex structure to form a subwavelength grating; a low refractive index layer located on the high refractive index layer and having a surface shape following a concavo-convex structure on a surface of the high refractive index layer, wherein the high refractive index layer has a refractive index higher than both of refractive indices of the concavo-convex structure layer and the low refractive index layer.

According to the above configuration, a guided-mode resonance phenomenon occurs in a grating region including the first grating high refractive index region and a grating region including the second grating high refractive index region among the regions extending in the cross-sectional direction perpendicular to the thickness direction. Accordingly, since light enhanced by the two grating regions is obtained as reflected light, the intensity of light extracted as reflected light increases compared with a wavelength selective filter having only a single grating region. Further, since the low refractive index layer having a surface shape following the concavo-convex structure on a surface of the high refractive index layer is provided, it is possible to cancel light in a wavelength range different from the reflected light enhanced by the above grating regions by adjusting the thickness and refractive index of the low refractive index layer, to thereby prevent such light from being emitted together with the reflected light. Accordingly, the wavelength selectivity of the wavelength selective filter is increased.

A display for solving the above problem includes a display element, the display element being formed of the above wavelength selective filter.

According to the above configuration, the wavelength selectivity of the display element is increased. This increases the sharpness and brightness of colors observed in the display, and thus increases the visibility of the image produced by the display.

An optical device for solving the above problem includes: a filter layer including a plurality of filter regions composed of the above wavelength selective filter; and a light receiving layer including a plurality of photoelectric conversion elements disposed corresponding to each of the filter regions, the photoelectric conversion elements being configured to receive transmitted light from the filter regions, wherein the plurality of filter regions include a plurality of the filter regions configured to reflect light in wavelength ranges different from each other and/or a plurality of the filter regions in which the grating structures have arrangement directions different from each other.

According to the above configuration, the characteristics of incident light, that is, the wavelength range and polarization direction can be detected by comparing the intensities of transmitted light in the filter regions having characteristics different from each other based on the outputs from the photoelectric conversion elements. The filter using a guided-mode resonance phenomenon has narrow wavelength selectivity determined by the refractive indices of the materials, the period of grating structure, and the like. This wavelength selectivity is higher than that of a filter using a dye having a wide absorption band due to interaction between molecules. Therefore, the accuracy in selection of light in the optical device can be increased by using the filter layer having the above filter regions.

A method of producing a wavelength selective filter for solving the above problem includes the steps of: forming a concavo-convex structure layer using a first low refractive index material, the concavo-convex structure layer having concavo-convex elements on a surface, the concavo-convex elements being composed of a plurality of protrusions and recesses arranged having a subwavelength period; forming a high refractive index layer using a high refractive index material having a refractive index higher than that of the first low refractive index material, the high refractive index layer being formed on a surface of the concavo-convex structure layer, and including a first grating high refractive index region located on a bottom of the concavo-convex structure of the concavo-convex structure layer to form a subwavelength grating, and a second grating high refractive index region located on a top of the concavo-convex structure to form a subwavelength grating; and forming a low refractive index layer using a second low refractive index material having a refractive index lower than that of the high refractive index material, the low refractive index layer being formed on a surface of the high refractive index layer, and having a surface shape following a concavo-convex structure on the surface of the high refractive index layer.

According to the above method, compared with a configuration in which a layer in contact with the grating region is used as a waveguide layer, a wavelength selective filter having high wavelength selectivity can be produced without requiring precise control of a film thickness of a layer in contact with the grating region. Therefore, such a wavelength selective filter can be easily produced.

Advantageous Effects of the Invention

According to embodiments of the present disclosure, the wavelength selectivity of a wavelength selective filter can be improved.

BRIEF DESCRIPTION OF THE DRAWINGS

FIG. 1(a)-FIG. 1(d) are diagrams illustrating a structure of a wavelength selective filter according to a first embodiment, in which FIG. 1(a) illustrates a cross-sectional structure of the wavelength selective filter, FIG. 1(b) illustrates a cross-sectional structure of a first grating region, FIG. 1(c) illustrates a cross-sectional structure of an intermediate region, and FIG. 1(d) illustrates a cross-sectional structure of a second grating region.

FIG. 14(a)-FIG. 14(d) are diagrams illustrating a structure of a wavelength selective filter according to a fourth embodiment, in which FIG. 14(a) illustrates a cross-sectional structure of the wavelength selective filter, FIG. 14(b) illustrates a cross-sectional structure of a first grating region, FIG. 14(c) illustrates a cross-sectional structure of an intermediate region, and FIG. 14(d) illustrates a cross-sectional structure of a second grating region.

FIG. 18(a)-FIG. 18(d) are diagrams illustrating an example of a structure of a filter region according to the fifth embodiment, in which FIG. 18(a) illustrates a cross-sectional structure of the filter region, FIG. 18(b) illustrates a cross-sectional structure of a first grating region, FIG. 18(c) illustrates a cross-sectional structure of an intermediate region, and FIG. 18(d) illustrates a cross-sectional structure of a second grating region.

FIG. 22(a)-FIG. 22(d) are diagrams illustrating an example of a structure of a filter region according to the fifth embodiment, in which FIG. 22(a) illustrates a cross-sectional structure of the filter region, FIG. 22(b) illustrates a cross-sectional structure of a first grating region, FIG. 22(c) illustrates a cross-sectional structure of an intermediate region, and FIG. 22(d) illustrates a cross-sectional structure of a second grating region.

DETAILED DESCRIPTION

Description of the Embodiments

Figure 1:
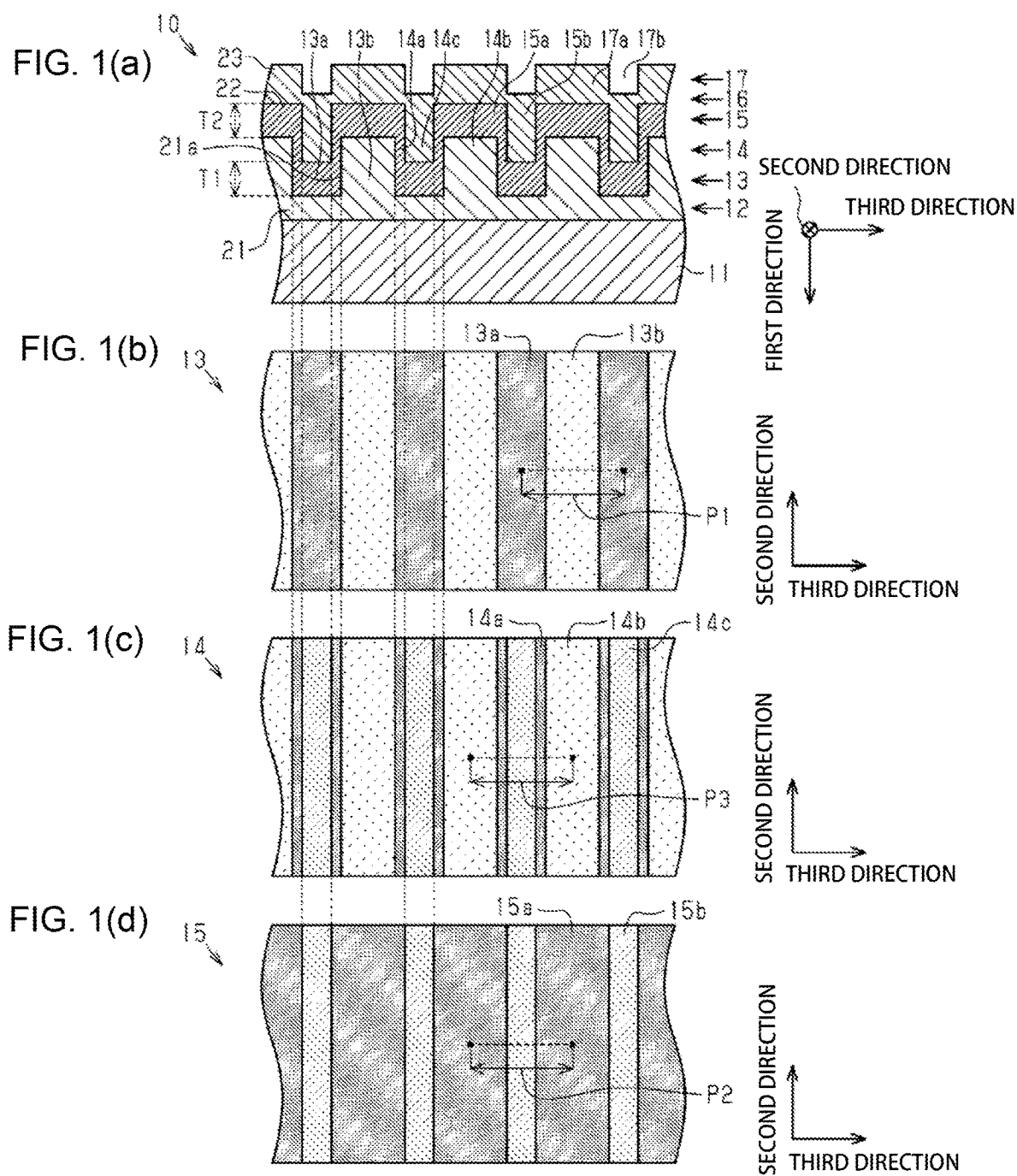

Embodiments of the present disclosure are a group of embodiments based on a single unique invention from the background. Further, aspects of the present disclosure are those of a group of embodiments based on a single invention. Configurations of the present disclosure may include each aspect of the present disclosure. Features of the present disclosure can be combined with each other and constitute each configuration. Accordingly, features of the present disclosure, configurations of the present disclosure, aspects of the present disclosure, and embodiments of the present disclosure can be combined with each other, and these combinations may have synergistic functions and can perform synergistic effects.

First Embodiment

With reference to FIGS. 1 to 8, a first embodiment of a wavelength selective filter, a display, and a method of producing a wavelength selective filter will be described. A wavelength selective filter has a function of extracting light in a specific wavelength range from light incident on the wavelength selective filter. The wavelength selective filter can have a function of extracting light by reflection, transmission, absorption, scattering, or diffraction of incident light, or a combination thereof. The wavelength range to be selected by the wavelength selective filter can be light in the visible region. Light in the visible region can be light that is visible to the naked eye of a human. In the following description, the wavelength of light in the visible region is 400 nm or more and 800 nm or less.

[Overall Configuration of Wavelength Selective Filter]

As shown in FIG. 1(a), a wavelength selective filter 10 includes a substrate 11, a first low refractive index region 12, a first grating region 13, an intermediate region 14, a second grating region 15, a second low refractive index region 16, and a top region 17. Each of these regions extends in a layer form. The first low refractive index region 12, the first grating region 13, the intermediate region 14, the second grating region 15, the second low refractive index region 16, and the top region 17 are stacked in this order on the substrate 11. The direction in which the respective regions are stacked is a first direction. That is, the first direction is a thickness direction of the respective regions and the wavelength selective filter 10. Further, a side of the wavelength selective filter 10 on which the top region 17 is located and facing away from the substrate 11 is a front surface, and a side of the wavelength selective filter 10 on which the substrate 11 is located and facing away from the top region 17 is a rear surface. In FIG. 1(b) is a cross-section of the first grating region 13 in a direction perpendicular to the first direction, FIG. 1(c) is a cross-section of the intermediate region 14 in a direction perpendicular to the first direction, and FIG. 1(d) is a cross-section of the second grating region 15 in a direction perpendicular to the first direction.

The substrate 11 may have the form of a plate, a sheet, or a film. A surface of the substrate 11 located on a side close to the front surface of the wavelength selective filter 10 is a front surface of the substrate 11. When the wavelength range to be selected by the wavelength selective filter 10 is light in the visible region, the substrate 11 may be a glass plate or a transparent polymer film. An example of the glass plate is a synthetic quartz substrate. A base film of the transparent polymer film may be made of polyethylene terephthalate, polyethylene naphthalate, polypropylene, polyethylene, or polycarbonate.

The first low refractive index region 12, which is in contact with a surface of the substrate 11, uniformly extends across the surface of the substrate 11. The first grating region 13 includes first grating high refractive index regions 13a and first grating low refractive index regions 13b. When viewed from a position facing the surface of the substrate 11, that is, viewed in a direction parallel to the first direction, the first grating high refractive index regions 13a and the first grating low refractive index regions 13b have a strip shape extending in a common direction, which is a second direction. These regions are alternately arranged in a third direction that is perpendicular to the second direction. The second direction and the third direction are both perpendicular to the first direction.

The intermediate region 14 includes intermediate high refractive index regions 14a, first intermediate low refractive index regions 14b, and second intermediate low refractive index regions 14c. These regions extend in the second direction when viewed in a direction parallel to the first direction. The first intermediate low refractive index regions 14b and the second intermediate low refractive index regions 14c are alternately arranged in the third direction with the intermediate high refractive index regions 14a interposed therebetween. That is, the first intermediate low refractive index region 14b, the intermediate high refractive index region 14a, the second intermediate low refractive index region 14c, and the intermediate high refractive index region 14a are repeatedly arranged in this order in the third direction. The first intermediate low refractive index region 14b is located on the first grating low refractive index region 13b. The intermediate high refractive index region 14a is located on an end portion of the first grating high refractive index region 13a in the width direction, and the second intermediate low refractive index region 14c is located on a center portion of the first grating high refractive index region 13a in the width direction.

The second grating region 15 includes second grating high refractive index regions 15a and second grating low refractive index regions 15b. When viewed in a direction parallel to the first direction, the second grating high refractive index regions 15a and the second grating low refractive index regions 15b have a strip shape extending in the second direction and are alternately arranged in the third direction. That is, in the two grating regions 13 and 15, the high refractive index regions and the low refractive index regions are arranged in the same direction. The second grating high refractive index region 15a is located on the first intermediate low refractive index region 14b and the intermediate high refractive index region 14a, while the second grating low refractive index region 15b is located on the second intermediate low refractive index region 14c.

The second low refractive index region 16, which is on the second grating region 15 on a side opposite to that on which the intermediate region 14 is located, uniformly extends across the second grating region 15. The top region 17 includes first top low refractive index regions 17a and second top low refractive index regions 17b. When viewed in a direction parallel to the first direction, the first top low refractive index regions 17a and the second top low refractive index regions 17b have a strip shape extending in the second direction and are alternately arranged in the third direction. The first top low refractive index region 17a is located on the second grating high refractive index region 15a with the second low refractive index region 16 interposed therebetween, and the second top low refractive index region 17b is located on the second grating low refractive index region 15b with the second low refractive index region 16 interposed therebetween.

In the above regions constituting the wavelength selective filter 10, regions adjacent to each other in the first direction are continuous with each other in part thereof. Specifically, the first low refractive index region 12 and the first grating low refractive index region 13b are continuous with each other, and the first grating low refractive index region 13b and the first intermediate low refractive index region 14b are continuous with each other. These can be made of the same material. The first grating high refractive index region 13a and the intermediate high refractive index region 14a are continuous with each other, and the intermediate high refractive index region 14a and the second grating high refractive index region 15a are continuous with each other. These can be made of the same material. The second intermediate low refractive index region 14c and the second grating low refractive index region 15b are continuous with each other, the second grating low refractive index region 15b and the second low refractive index region 16 are continuous with each other, and the second low refractive index region 16 and the first top low refractive index region 17a are continuous with each other. These can be made of the same material. Further, the second top low refractive index region 17b is filled with air.

That is, the wavelength selective filter 10 can be regarded as a structure which includes: the substrate 11; a concavo-convex structure layer 21 provided with a surface having a concavo-convex structure composed of a plurality of protrusions 21a, the concavo-convex structure layer 21 being located on the substrate 11; a high refractive index layer 22 disposed on the surface of the concavo-convex structure layer 21; and a low refractive index layer 23 disposed on a surface of the high refractive index layer 22. The plurality of protrusions 21a extend in the second direction and are arranged in the third direction. The high refractive index layer 22 has a surface shape following the concavo-convex structure of the concavo-convex structure layer 21, and the low refractive index layer 23 has a surface shape following the concavo-convex structure of the high refractive index layer 22.

The concavo-convex structure layer 21 is composed of the first low refractive index region 12, the first grating low refractive index regions 13b, and the first intermediate low refractive index regions 14b. The protrusion 21a is composed of the first grating low refractive index regions 13b and the first intermediate low refractive index regions 14b.

The high refractive index layer 22 is composed of the first grating high refractive index regions 13a, the intermediate high refractive index regions 14a, and the second grating high refractive index regions 15a. The first grating high refractive index region 13a is located between the plurality of protrusions 21a, that is, located on the bottom of a concavo-convex structure of the concavo-convex structure layer 21. The intermediate high refractive index region 14a is in contact with a side surface of the protrusion 21a, and extends in the thickness direction of the intermediate region 14, connecting the end portions of the first grating high refractive index region 13a and the second grating high refractive index region 15a adjacent to each other when viewed in a direction parallel to the first direction. The second grating high refractive index region 15a covers the top of the protrusion 21a, that is, located on the top of the concavo-convex structure of the concavo-convex structure layer 21.

The low refractive index layer 23 is composed of the second intermediate low refractive index regions 14c, the second grating low refractive index regions 15b, the second low refractive index region 16, and the first top low refractive index regions 17a. The low refractive index layer 23 has a shape in which the second intermediate low refractive index regions 14c and the second grating low refractive index regions 15b protrude from the second low refractive index region 16 toward the substrate 11, and the first top low refractive index regions 17a protrude from the second low refractive index region 16 in a direction away from the substrate 11. A surface of the low refractive index layer 23 has a concavo-convex structure, and the second top low refractive index regions 17b correspond to the recesses of the concavo-convex structure.

The high refractive index layer 22 has a refractive index higher than a refractive index of air, and higher than both of the refractive indices of the concavo-convex structure layer 21 and the low refractive index layer 23. That is, each of the refractive indices of the first grating high refractive index region 13a, the intermediate high refractive index region 14a, and the second grating high refractive index region 15a is higher than all of the refractive indices of the first low refractive index region 12, the first grating low refractive index region 13b, the first intermediate low refractive index region 14b, the second intermediate low refractive index region 14c, the second grating low refractive index region 15b, the second low refractive index region 16, the first top low refractive index region 17a, and the second top low refractive index region 17b.

The concavo-convex structure layer 21 and the low refractive index layer 23 have a refractive index higher than the refractive index of air. In order to suitably produce a guided-mode resonance phenomenon, differences in refractive index between the concavo-convex structure layer 21 and the high refractive index layer 22 and between the low refractive index layer 23 and the high refractive index layer 22 are preferably large, and each of these differences in refractive index is preferably larger than a difference in refractive index between the concavo-convex structure layer 21 and the low refractive index layer 23. Further, the refractive index of the low refractive index layer 23 adjacent to the air layer is preferably lower than or equal to the refractive index of the concavo-convex structure layer 21.

Moreover, the refractive index of the concavo-convex structure layer 21 is preferably different from the refractive index of the low refractive index layer 23. Accordingly, due to optical asymmetry in the wavelength selective filter 10, one of the front surface and the rear surface can emit more light than the other. The difference in refractive index between the concavo-convex structure layer 21 and the low refractive index layer 23 can be 0.01 or more and 0.3 or less. When the difference in refractive index is 0.01 or more, sufficient optical asymmetry is provided. When the difference in refractive index is 0.3 or less, optical asymmetry does not become too large, which prevents disturbance in resonance of light in the grating regions 13 and 15.

When the wavelength range to be selected by the wavelength selective filter 10 is light in the visible region, materials of the concavo-convex structure layer 21, the high refractive index layer 22, and the low refractive index layer 23 can be substances that do not have absorption wavelengths in the visible region, that is, substances transparent to light in the visible region. Specifically, the low refractive index material (first low refractive index material) of the concavo-convex structure layer 21 can be polymers. These polymers can be UV-curable resins, thermoplastic resins, heat-curable resins, or the like. Examples of these resins include acrylic resins, urethane resins, urethane acrylic resins, epoxy resins, polycarbonate resins, polyolefin resins, and polyester resins.

The concavo-convex structure layer 21 may contain a filler having a nano-size diameter. The filler can be an inorganic filler. The inorganic filler can be a silica filler, a metal filler, or a metal compound filler. Examples of the metal filler include a zirconium filler. Examples of the metal compound filler include an aluminum oxide filler and a titanium oxide filler. The concavo-convex structure layer 21 may contain any one of these fillers or a mixture of two or more of these fillers. The type and content of the fillers can be selected to adjust, for example, the refractive index of the concavo-convex structure layer 21. Thus, the difference in refractive index between the concavo-convex structure layer 21 and the high refractive index layer 22, and the difference in refractive index between the concavo-convex structure layer 21 and the low refractive index layer 23 can be adjusted. When it is desired to contain a filler with a low refractive index, a filler having a porous structure or a filler having hollow particles can be used.

The low refractive index material (second low refractive index material) of the low refractive index layer 23 can be an inorganic compound. The inorganic compound can be an oxide. Examples of the oxide include silicon oxide. The inorganic compound may also be a nitride or a fluoride. Examples of the nitride include calcium nitride. Examples of the fluoride include magnesium fluoride.

The high refractive index material of the high refractive index layer 22 can be an inorganic compound. The inorganic compound is preferably a metal compound, since a high refractive index is easily obtained. Examples of the metal compound include titanium oxide, niobium oxide, tantalum oxide, zirconium oxide, zinc sulfide, indium tin oxide, and aluminum nitride.

[Effect of Wavelength Selective Filter]

A period of grating structure (first grating structure) in the first grating region 13, that is, an arrangement period of the first grating high refractive index regions 13a is a first period P1. The first period P1 is smaller than the wavelength of light in the visible region. Similarly, a period of grating structure (second grating structure) in the second grating region 15, that is, an arrangement period of the second grating high refractive index regions 15a is a second period P2. The second period P2 is smaller than the wavelength of light in the visible region. That is, the first period P1 and the second period P2 are subwavelength periods, and thus the first grating region 13 and the second grating region 15 include a subwavelength grating.

In the wavelength selective filter 10, an average refractive index in each region is, in practical terms, a value obtained by averaging the refractive index of the high refractive index region and the refractive index of the low refractive index region according to a volume ratio between the high refractive index region and the low refractive index region in each region. The ratio of the intermediate high refractive index regions 14a to the intermediate region 14 is smaller than both of the ratio of the first grating high refractive index regions 13a to the first grating region 13 and the ratio of the second grating high refractive index regions 15a to the second grating region 15. Accordingly, the average refractive index of the intermediate region 14 is lower than both of the average refractive index of the first grating region 13 and the average refractive index of the second grating region 15. That is, the wavelength selective filter 10 has a structure in which the subwavelength gratings of the first grating region 13 and the second grating region 15 are embedded in a region having a low refractive index.

When light is incident on the front surface of the wavelength selective filter 10, emission of diffracted light toward the front surface is suppressed due to the subwavelength grating of the second grating region 15 being embedded in the region having a low refractive index, and thus a guided-mode resonance phenomenon occurs in the second grating region 15. That is, light in a specific wavelength range propagates with multiple reflections in the second grating region 15, causing resonance so that light in a specific wavelength range is emitted as reflected light from the front surface of the wavelength selective filter 10.

Light that has passed through the second grating region 15 and subsequently through the intermediate region 14 enters the first grating region 13. When light is incident on the first grating region 13, a guided-mode resonance phenomenon occurs also in the first grating region 13 since the subwavelength grating of the first grating region 13 is embedded in the region having a low refractive index. That is, light in a specific wavelength range propagates with multiple reflections in the first grating region 13, causing resonance so that light in the specific wavelength range is emitted as reflected light from the front surface of the wavelength selective filter 10.

Light that has passed through the first grating region 13 further passes through the first low refractive index region 12 and the substrate 11, and exits the rear surface of the wavelength selective filter 10.

As a result, light in a wavelength range enhanced by the second grating region 15 and light in a wavelength range enhanced by the first grating region 13 are emitted from the front surface of the wavelength selective filter 10. Further, light that has passed through the respective regions constituting the wavelength selective filter 10 is emitted as transmitted light from the rear surface of the wavelength selective filter 10. According to the wavelength selective filter 10, light in a wavelength range enhanced by the grating regions 13 and 15 can thus be extracted as reflected light. Therefore, the intensity of reflected light to be extracted increases compared with a configuration in which a single grating region is provided. Further, light in a wavelength range different from that enhanced by the grating regions 13 and 15 can be extracted as transmitted light.

Here, in addition to light in a wavelength range enhanced by the grating regions 13 and 15, light caused by reflection and interference in the respective regions constituting the wavelength selective filter 10 may be emitted from the front surface of the wavelength selective filter 10. Such light includes light (non-target light) in a wavelength range different from that enhanced by the grating regions 13 and 15. As the intensity of non-target light emitted from the front surface of the wavelength selective filter 10 increases, the wavelength selectivity for light extracted from the front surface of the wavelength selective filter 10 decreases, and thus the sharpness of the color of light emitted from the front surface decreases.

On the other hand, according to the present embodiment, the top region 17 of the wavelength selective filter 10 has a function of preventing light in a wavelength range different from that enhanced by the grating regions 13 and 15 from being emitted from the front surface of the wavelength selective filter 10. In other words, the top region 17 is configured to cancel non-target light. Specifically, the top region 17 reduces the intensity of non-target light emitted from the front surface by mitigating the non-target light by interference or reflecting the non-target light toward the rear surface. The wavelength range of light to be cancelled by the top region 17 can be adjusted using the thickness and average refractive index of the top region 17, in other words, the thickness and material of the low refractive index layer 23. That is, the thickness and material of the low refractive index layer 23 are selected so that emission of light in a wavelength range other than that enhanced by the grating regions 13 and 15 from the front surface can be reduced by the top region 17.

Further, due to a surface of the low refractive index layer 23 which is the outermost surface of the wavelength selective filter 10 having a concavo-convex structure, surface reflection of the wavelength selective filter 10 can be reduced compared with a configuration in which the outermost surface of the wavelength selective filter 10 is flat. This also contributes to reduction of emission of light other than that in a wavelength range enhanced by the grating regions 13 and 15 from the front surface. Accordingly, the wavelength selectivity for light extracted from the front surface of the wavelength selective filter 10 can be increased.

When the subwavelength grating is composed of the grating high refractive index regions 13a and 15a having a strip shape extending in one direction, light polarized in a specific direction, which depends on the arrangement direction of the subwavelength grating, propagates with multiple reflections in the grating regions 13 and 15, causing resonance so that the light is emitted as reflected light. Therefore, according to the wavelength selective filter 10 of the first embodiment, reflected light can be extracted as reflected light polarized in the specific direction with increased wavelength selectivity.

[Detailed Configuration of Wavelength Selective Filter]

In the above wavelength selective filter 10, the wavelength range of light that undergoes resonance in the first grating region 13 and the wavelength range of light that undergoes resonance in the second grating region 15 may be set according to the wavelength ranges desired to be extracted. For example, when it is desired to extract reflected light in a narrower range with higher intensity, that is, when it is desired to increase the wavelength selectivity for reflected light, the wavelength range of light that undergoes resonance in the first grating region 13 and the wavelength range of light that undergoes resonance in the second grating region 15 are preferably close to each other.

For example, when a difference in refractive index between the second grating region 15 and the intermediate region 14 is small, light in a specific wavelength range that undergoes resonance in the second grating region 15 partially leaks into the intermediate region 14 for each reflection in the second grating region 15. Even in this case, if the wavelength ranges of light that undergoes resonance in the first grating region 13 and the second grating region 15 coincide with each other, the light in a specific wavelength range that has leaked into the intermediate region 14 as described above enters the first grating region 13 and undergoes resonance, whereby it is emitted as reflected light. Accordingly, the wavelength selectivity for reflected light emitted from the wavelength selective filter 10 can be increased.

In order to match the wavelength range of light that undergoes resonance in the first grating region 13 and the wavelength range of light that undergoes resonance in the second grating region 15, optical film thicknesses of the first grating region 13 and the second grating region 15, which are parameters obtained by multiplying the average refractive index and the film thickness, may be matched with each other. That is, as the optical film thicknesses of the first grating region 13 and the second grating region 15 are closer to each other, the wavelength ranges of light that undergoes resonance in the first grating region 13 and the second grating region 15 are closer to each other, which increases the wavelength selectivity. The inventors of the present application have found, from simulation, a range of ratio of the optical film thickness between the first grating region 13 and the second grating region 15 at which favorable wavelength selectivity for reflected light is obtained. A detailed description will be given below.

A volume ratio of the first grating high refractive index regions 13a to the entire first grating region 13 is equal to an area ratio of the first grating high refractive index regions 13a to the entire first grating region 13 in plan view as viewed in a direction parallel to the first direction. In other words, the area ratio is a ratio of the area occupied by the first grating high refractive index regions 13a in a cross-section including the first grating high refractive index regions 13a and perpendicular to the thickness direction thereof. When the area of the first grating high refractive index regions 13a varies depending on the position in the cross-section, the area ratio of the first grating high refractive index regions 13a in a cross-section in which the first grating high refractive index regions 13a has a maximum area is employed.

When the above area ratio of the first grating high refractive index regions 13a is defined as R1, an area ratio of the first grating low refractive index regions 13b in the above cross-section is given by 1−R1.

When a refractive index of the high refractive index layer 22 is defined as n1, and a refractive index of the concavo-convex structure layer 21 is defined as n2 (n1>n2), an average refractive index NA1 of the first grating region 13 is given by the following formula (1):

$$NA1 = n1 \times R1 + n2 \times (1-R1) \quad (1)$$

Further, an optical film thickness OT1 (first parameter) of the first grating region 13 is given by the following formula (2) using the average refractive index NA1 and a thickness T1 of the first grating region 13:

$$\begin{aligned} OT1 &= T1 \times NA1 \\ &= T1 \times \{n1 \times R1 + n2 \times (1-R1)\} \end{aligned} \quad (2)$$

The second period P2, which is a period of grating structure in the second grating region 15, coincides with the first period P1 in the first grating region 13.

When viewed in a direction parallel to the first direction, the width of the second grating high refractive index regions 15a in the second grating region 15 is larger than the width of the first grating low refractive index regions 13b in the first grating region 13. Further, the width of the second grating low refractive index regions 15b is smaller than the width of the first grating high refractive index regions 13a.

A volume ratio of the second grating high refractive index regions 15a to the entire second grating region 15 is equal to an area ratio of the second grating high refractive index regions 15a to the entire second grating region 15 in plan view as viewed in a direction parallel to the first direction. In other words, the area ratio is a ratio of the area occupied by the second grating high refractive index regions 15a in a cross-section including the second grating high refractive index regions 15a and perpendicular to the thickness direction thereof. When the area of the second grating high refractive index regions 15a varies depending on the position in the cross-section, the area ratio of the second grating high refractive index regions 15a in a cross-section in which the second grating high refractive index regions 15a has a maximum area is employed.

When the above area ratio of the second grating high refractive index regions 15a is defined as R2, an area ratio of the second grating low refractive index regions 15b in the above cross-section is given by 1−R2.

When a refractive index of the high refractive index layer 22 is defined as n1, and a refractive index of the low refractive index layer 23 is defined as n3 (n1>n3), an average refractive index NA2 of the second grating region 15 is given by the following formula (3):

$$NA2 = n1 \times R2 + n3 \times (1-R2) \quad (3)$$

Further, an optical film thickness OT2 (second parameter) of the second grating region 15 is given by the following formula (4) using the average refractive index NA2 and a thickness T2 of the second grating region 15:

$$\begin{aligned} OT2 &= T2 \times NA2 \\ &= T2 \times \{n1 \times R2 + n3 \times (1-R2)\} \end{aligned} \quad (4)$$

As the ratio of the optical film thickness OT2 of the second grating region 15 to the optical film thickness OT1 of the first grating region 13 (OT2/OT1) is closer to 1, the wavelength ranges of light that undergoes resonance in the first grating region 13 and the second grating region 15 are closer to each other. On the other hand, as the above ratio becomes further from 1, the wavelength ranges of light that undergoes resonance in the first grating region 13 and the second grating region 15 become further away from each other. When the wavelength ranges of light that undergoes resonance in the first grating region 13 and the second grating region 15 are intentionally made different, the above ratio may be, for example, larger than 2.0 or smaller than 0.5. Further, when the value of OT2/OT1 is 0.5 or more and 2.0 or less, stable production of the wavelength selective filters 10 is possible, and the wavelength selective filters 10 as industrial products can be easily produced for practical applications.

However, when the wavelength ranges of light that undergoes resonance in the first grating region 13 and the second grating region 15 are different from each other and light in a desired wavelength range undergoes resonance in one of the first grating region 13 and the second grating region 15, light in a wavelength range that undergoes resonance in the other of the regions may affect the wavelength selectivity of the wavelength selective filter 10, leading to a decrease in the wavelength selectivity. That is, the wavelength range to be selected may become wider, or noise may occur in the selected wavelength range.

The inventors of the present application have conceived that controlling the ratio of the optical film thickness OT2 of the second grating region 15 to the optical film thickness OT1 of the first grating region 13 (OT2/OT1) is of importance to obtain high wavelength selectivity. The inventors of the present application have found a range of the ratio at which favorable wavelength selectivity is achieved and suitability as an industrial product such as stable production is obtained. That is, it was found that the value of OT2/OT1 is preferably 0.5 or more and 2.0 or less from the viewpoint of improving the suitability as an industrial product, while it is preferably 0.625 or more and 1.6 or less from the viewpoint of improving the wavelength selectivity.

When the value of OT2/OT1 is 1.0, that is, when the optical film thickness OT1 and the optical film thickness OT2 coincide with each other, the wavelength range of light that undergoes resonance in the first grating region 13 and the wavelength range of light that undergoes resonance in the second grating region 15 coincide with each other, which particularly increases the wavelength selectivity. Accordingly, it is preferred that materials of the layers are selected and the thicknesses T1 and T2 and the width of the protrusions 21a of the concavo-convex structure layer 21 are set so that the optical film thickness OT1 and the optical film thickness OT2 coincide with each other. As the difference in refractive index between the material of the concavo-convex structure layer 21 and the material of the low refractive index layer 23 becomes smaller, the ratio of the optical film thickness OT2 to the optical film thickness OT1 becomes closer to 1.0.

For example, the area ratio R1 of the first grating high refractive index regions 13a and the area ratio R2 of the second grating high refractive index regions 15a can be made close to each other by setting the width of the protrusions 21a so that the area ratio of the first grating low refractive index regions 13b becomes smaller than the area ratio of the first grating high refractive index regions 13a in the first grating region 13, and the area ratio of the second grating high refractive index regions 15a becomes larger than the area ratio of the second grating low refractive index regions 15b in the second grating region 15. In this case, each of the area ratio R1 of the first grating high refractive index regions 13a and the area ratio R2 of the second grating high refractive index regions 15a are larger than 0.5, and R1+R2 is larger than 1.

When the area ratios R1 and R2 are larger than 0.5, the average refractive index of the grating regions 13 and 15 is higher than that in a configuration in which the area ratios R1 and R2 are 0.5 or less. This results in an increased difference between the average refractive index of the grating regions 13 and 15 and the average refractive index of the grating regions 12, 14, and 16 that alternate with the grating regions 13 and 15. As a consequence, loss due to multiple reflections in the grating regions 13 and 15 decreases, and thus the intensity of reflected light emitted from the grating regions 13 and 15 increases.

A third period P3, which is an arrangement period of the first intermediate low refractive index regions 14b in the intermediate region 14, coincides with the first period P1 in the first grating region 13. When viewed in a direction parallel to the first direction, the width of the first intermediate low refractive index region 14b coincides with the width of the first grating low refractive index region 13b.

An area ratio of the intermediate high refractive index regions 14a to the entire intermediate region 14 in plan view as viewed in a direction parallel to the first direction is preferably smaller than or equal to a difference between the area ratio of the second grating high refractive index regions 15a and the area ratio of the first grating low refractive index regions 13b. That is, when the area ratio of the intermediate high refractive index regions 14a is defined as R3, R3 preferably satisfies the following formula (5). In other words, the area ratio is a ratio of the area occupied by the intermediate high refractive index regions 14a in a cross-section including the intermediate high refractive index regions 14a and perpendicular to the thickness direction thereof. When the area of the intermediate high refractive index regions 14a varies depending on the position in the cross-section, the area ratio of the intermediate high refractive index regions 14a in a cross-section in which the intermediate high refractive index regions 14a has a maximum area is employed.

$$R3 \leq R2-(1-R1)=R1+R2-1 \quad (5)$$

When a region where the second grating high refractive index region 15a is located coincides with a region where the first intermediate low refractive index region 14b and the intermediate high refractive index region 14a are located when viewed in a direction parallel to the first direction, the area ratio R3 of the intermediate high refractive index regions 14a is equal to R1+R2−1 on the right side. When a region where the second grating high refractive index region 15a is located is larger than a region where the first intermediate low refractive index region 14b and the intermediate high refractive index region 14a are located when viewed in a direction parallel to the first direction, in other words, when the intermediate high refractive index region 14a is located inside the outer edge of the second grating high refractive index region 15a, the area ratio R3 is smaller than R1+R2−1.

As described above, in order to increase the intensity of reflected light emitted from the grating regions 13 and 15 due to the guided-mode resonance phenomenon, a difference between the average refractive index of the grating regions 13 and 15 and the average refractive index of the grating regions 12, 14, and 16 that alternate with the grating regions 13 and 15 is preferably large. Accordingly, a lower average refractive index of the intermediate region 14 is preferred, that is, a smaller area ratio of the intermediate high refractive index regions 14a is preferred. In a configuration in which the formula (5) is satisfied, the width of the intermediate high refractive index region 14a is prevented from extending outside the second grating high refractive index region 15a, and thus the area ratio of the intermediate high refractive index regions 14a is prevented from being excessively large. This improves the intensity of light reflected from the grating regions 13 and 15.

In order to increase the intensity of the above reflected light, it is preferred that differences in average refractive index between the first grating region 13 and the first low refractive index region 12 and between the first grating region 13 and the intermediate region 14 are both larger than 0.1. Similarly, it is preferred that differences in average refractive index between the second grating region 15 and the intermediate region 14 and between the second grating region 15 and the second low refractive index region 16 are both larger than 0.1.

Further, when the intermediate region 14 includes the intermediate high refractive index regions 14a within a range satisfying the above formula (5), fine adjustment of the average refractive index of the intermediate region 14 can be performed by adjusting the area ratio of the intermediate high refractive index regions 14a. Therefore, for example, the intermediate region 14 can be configured such that light in a wavelength range different from the wavelength range desired to be extracted as reflected light or transmitted light is cancelled by an effect such as interference in the intermediate region 14.

Further, an arrangement period of the first top low refractive index regions 17a in the top region 17 also coincides with the first period P1 in the first grating region 13.

[Method of Producing Wavelength Selective Filter]

Figure 2:
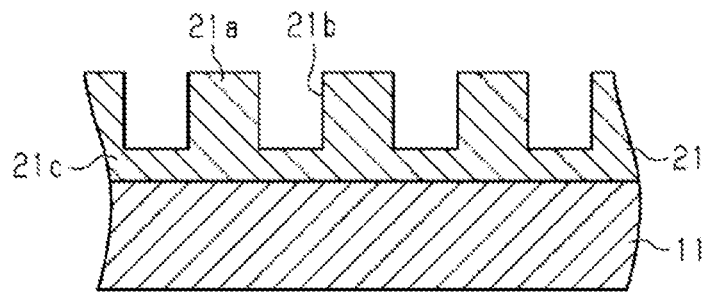
FIG. 2 is a diagram illustrating a step of forming a concavo-convex structure layer in a method of producing a wavelength selective filter according to the first embodiment.
Figure 3:
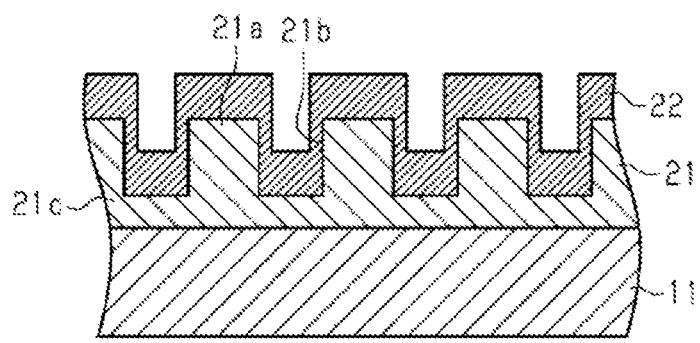
FIG. 3 is a diagram illustrating a step of forming a high refractive index layer in a method of producing a wavelength selective filter according to the first embodiment.
Figure 4:
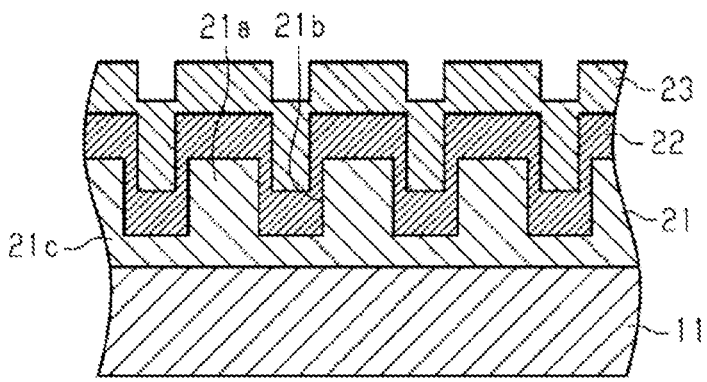
FIG. 4 is a diagram illustrating a step of forming a low refractive index layer in a method of producing a wavelength selective filter according to the first embodiment.

With reference to FIGS. 2 to 4, a method of producing the wavelength selective filter 10 will be described.

First, as shown in FIG. 2, a layer is formed on a surface of the substrate 11 using a low refractive index material (first low refractive index material), and a concavo-convex structure is formed on the surface of the layer to form a concavo-convex structure layer 21. The concavo-convex structure layer 21 includes a flat region 21c extending on the substrate 11, a plurality of protrusions 21a protruding from the flat region 21c, and a plurality of recesses 21b located between the protrusions 21a. The protrusions 21a and the recesses 21b have a strip shape extending in the second direction.

The concavo-convex structure can be formed by a known microfabrication method. The microfabrication method may be nanoimprinting or dry etching. In particular, nanoimprinting is preferred for ease of fabrication of fine protrusions 21a and recesses 21b.

The concavo-convex structure layer 21 can be formed using a UV-curable resin as the low refractive index material (photo nanoimprinting method). In this case, first, a surface of the substrate 11 is coated with a UV-curable resin. Then, a glass mold as an intaglio plate having an inverted concavo-convex shape of the concavo-convex shape composed of the protrusions 21a and the recesses 21b to be formed is pressed against a surface of the coating layer made of the UV-curable resin, and UV radiation is applied to the coating layer and the intaglio plate. Subsequently, a cured UV-curable resin is removed from the intaglio plate. Thus, the concavo-convex shape of the intaglio plate is transferred to the UV-curable resin to form protrusions 21a and recesses 21b. In addition, a residual film made of the UV-curable resin is left between the protrusions 21a and recesses 21b and the substrate 11 to form a flat region 21c.

The photo nanoimprinting method using a UV-curable resin is suitable as a method of forming the concavo-convex structure layer 21 of the present disclosure since it has high shape accuracy in formation of the concavo-convex structure (dimensional accuracy of the period of subwavelength grating and transfer accuracy of the intaglio plate). However, in some cases, a nanoimprinting method using a thermosetting or thermoplastic resin may be suitable as a method of forming the concavo-convex structure.

Next, as shown in FIG. 3, a high refractive index layer 22 made of a high refractive index material is formed on a surface of the concavo-convex structure layer 21. The high refractive index layer 22 can be formed by a known film-formation technique. An example of the known film-formation technique is a physical vapor deposition method. The physical vapor deposition method may be vacuum deposition or sputtering. The thickness of the high refractive index layer 22 is smaller than the height of the protrusions 21$a$, and may be set according to a desired thickness T1 and thickness T2. The thickness of the high refractive index layer 22 can be 10 nm or more and 500 nm or less.

When the high refractive index layer 22 is formed by physical vapor deposition, a layer formed on the protrusions 21$a$ of the concavo-convex structure layer 21 has a greater width than the protrusions 21$a$. That is, the width of the second grating high refractive index regions 15$a$ is larger than the widths of the first grating low refractive index regions 13$b$ and the first intermediate low refractive index regions 14$b$ constituting the protrusions 21$a$. Therefore, even when the protrusions 21$a$ and the recesses 21$b$ on the surface of the concavo-convex structure layer 21 are formed at the area ratio of 1:1 by physical vapor deposition, a difference occurs between the area ratio of the first grating high refractive index regions 13$a$ and the area ratio of the second grating high refractive index regions 15$a$.

In addition, as the width of the second grating high refractive index regions 15$a$ increases during film formation, it becomes difficult for particles of the vapor deposition material to be deposited onto the recesses 21$b$, and a difference may occur between the thickness T1 of the first grating high refractive index regions 13$a$ and the thickness T2 of the second grating high refractive index regions 15$a$.

In order to increase the wavelength selectivity of the wavelength selective filter 10, it is desired to set the width of the protrusions 21$a$, that is, the area ratio between the protrusions 21$a$ and the recesses 21$b$ so that the ratio of the optical film thickness OT2 to the optical film thickness OT1 becomes 0.5 or more and 2.0 or less, more preferably 0.625 or more and 1.6 or less, while compensating for the difference in area ratio or thickness caused by an increased width of the second grating high refractive index regions 15$a$.

Further, when the high refractive index layer 22 is formed by physical vapor deposition, a high refractive index material often adheres to a side surface of the protrusions 21$a$ of the concavo-convex structure layer 21. Accordingly, formation of the intermediate high refractive index regions 14$a$ cannot be avoided. Therefore, the width of the intermediate high refractive index regions 14$a$ can be controlled, as described above, to satisfy the above formula (5) so that the intensity of reflected light from the grating regions 13 and 15 can be suitably obtained.

The width of the intermediate high refractive index regions 14$a$ can be controlled by film formation methods and film formation conditions. Parameters of the film formation conditions include a film formation speed, a target shape, a target size, and a distance between a target and an object for deposition. Film formation may be performed once or a plurality of times. For example, vacuum deposition and sputtering are different in angle dependence for the incident direction of particles. Accordingly, the width of the intermediate high refractive index regions 14$a$ can be modified by using either vacuum deposition or sputtering, or a combination thereof. Alternatively, after the high refractive index layer 22 is formed by physical vapor deposition, etching may be performed to decrease the width of the intermediate high refractive index regions 14$a$.

Then, as shown in FIG. 4, a low refractive index layer 23 made of a low refractive index material (second low refractive index material) is formed on a surface of the high refractive index layer 22. The low refractive index layer 23 can be formed by a known film-formation technique. An example of the known film-formation technique is a physical vapor deposition method. The physical vapor deposition method may be vacuum deposition or sputtering. The thickness of the low refractive index layer 23 can be 10 nm or more and 500 nm or less.

As described above, the wavelength selective filter 10 is configured to emit light in a wavelength range enhanced by the first grating region 13 and light in a wavelength range enhanced by the second grating region 15 to thereby increase wavelength selectivity for the reflected light. Therefore, compared with a configuration in which a layer in contact with the grating region is used as a waveguide layer, the wavelength selective filter 10 does not require precise control of a film thickness of a layer in contact with the grating region. When the wavelength selective filter 10 is formed by nanoimprinting, the wavelength selective filter 10 with increased wavelength selectivity can be fabricated without requiring precise control of the film thickness of the residual film. Therefore, the wavelength selective filter 10 can be easily produced, and can be more easily produced by using a nanoimprinting method.

Furthermore, the wavelength selective filter 10 can be formed by a production method combining photo nanoimprinting, vacuum deposition, and the like. Accordingly, the wavelength selective filter 10 is suitable for production by a roll-to-roll method. Therefore, the structure of the wavelength selective filter 10 is also suitable for mass production.

In the above production method, the concavo-convex structure layer 21 may also be formed by nanoimprinting using a heat-curable resin or a thermoplastic resin in place of a UV-curable resin. When a heat-curable resin is used, UV radiation may be changed to heating. When a thermoplastic resin is used, UV radiation may be changed to heating and cooling.

[Modifications]

The wavelength selective filter 10 of the above embodiment may be modified as follows.

Figure 5:
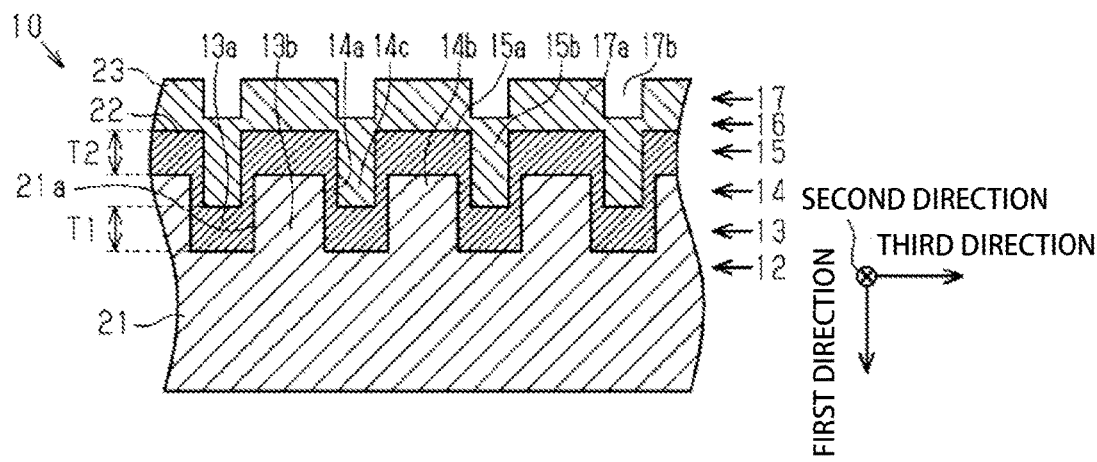
FIG. 5 is a diagram illustrating a cross-sectional structure of a modification of a wavelength selective filter according to the first embodiment.

As shown in FIG. 5, the wavelength selective filter 10 may not necessarily include the substrate 11. In this case, the concavo-convex structure layer 21 is fabricated by forming a concavo-convex structure on a surface of a plate made of a low refractive index material. For example, a sheet made of a thermoplastic resin may be used to form a concavo-convex structure on a surface of the sheet, or a substrate made of synthetic quartz may be used to form a concavo-convex structure on a surface of the substrate. A well-known technique such as dry etching may be used to form a concavo-convex structure on a substrate made of synthetic quartz.

Figure 6:
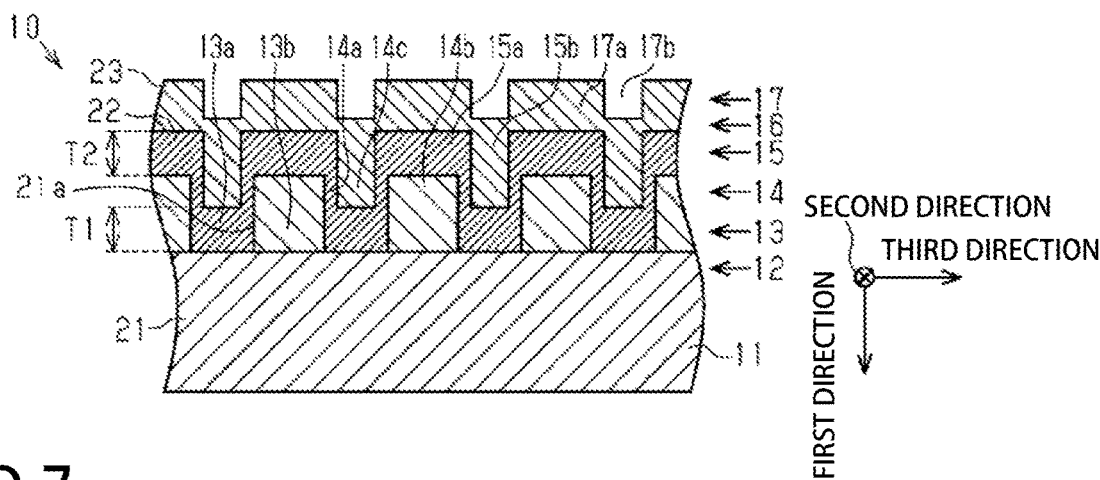
FIG. 6 is a diagram illustrating a cross-sectional structure of a modification of a wavelength selective filter according to the first embodiment.

Further, as shown in FIG. 6, the protrusions 21$a$ may be formed directly on a surface of the substrate 11. That is, the concavo-convex structure layer 21 may not necessarily have the flat region 21$c$ continuous to the protrusions 21$a$. In this case, the protrusions 21a and the substrate 11 constitute the concavo-convex structure layer 21, and a portion of the substrate 11 which is in contact with the protrusions 21a functions as the first low refractive index region 12. Such a concavo-convex structure layer 21 can be formed using, for example, photolithography.

Further, the low refractive index layer 23 may be made of a resin material and formed by various coating methods. However, in order to form the low refractive index layer 23 in a shape following the high refractive index layer 22, in other words, in order to form a concavo-convex structure on a surface of the low refractive index layer 23, the low refractive index layer 23 is preferably made of an inorganic compound and formed by physical vapor deposition.

Further, the wavelength selective filter 10 may not necessarily include the second low refractive index region 16, and the top region 17 may be located directly on the second grating region 15. In other words, the bottom of the recesses on a surface of the low refractive index layer 23 may be located at the same level as the top of the high refractive index layer 22, that is, the top of the second grating high refractive index regions 15a in the first direction. Moreover, part or all of the second grating low refractive index regions 15b may be continuous from the second top low refractive index regions 17b, and filled with air. In this case, the bottom of the recesses on a surface of the low refractive index layer 23 is located in the second grating region 15. Moreover, part of the second intermediate low refractive index regions 14c may be continuous from the second top low refractive index regions 17b, and filled with air. In this case, the bottom of the recesses on a surface of the low refractive index layer 23 is located in the intermediate region 14. The average refractive index of each region is a value obtained by averaging the refractive indices of substances, including air, constituting each region according to the volume ratio of portions occupied by the substances.

[Exemplary Application of Wavelength Selective Filter]

Specific exemplary application of the wavelength selective filter 10 will be described below. The wavelength selective filter 10 is applied to filters used for devices that perform color conversion or color separation of light, or displays. In the following description, an example in which the wavelength selective filter 10 is used for displays will be described.

A display may be used for the purpose of improving resistance against product counterfeiting or for the purpose of improving product designability or may be used for both purposes. For the purpose of increasing resistance against product counterfeiting, the display may be attached to, for example, authentication documents such as passports and licenses, securities such as gift certificates and checks, cards such as credit cards and cash cards, and bills. For the purpose of improving product designability, the display may be attached to, for example, wearable accessories, products carried around by users, installed products such as furniture and home electric appliances, and structures such as walls or doors.

Figure 7:
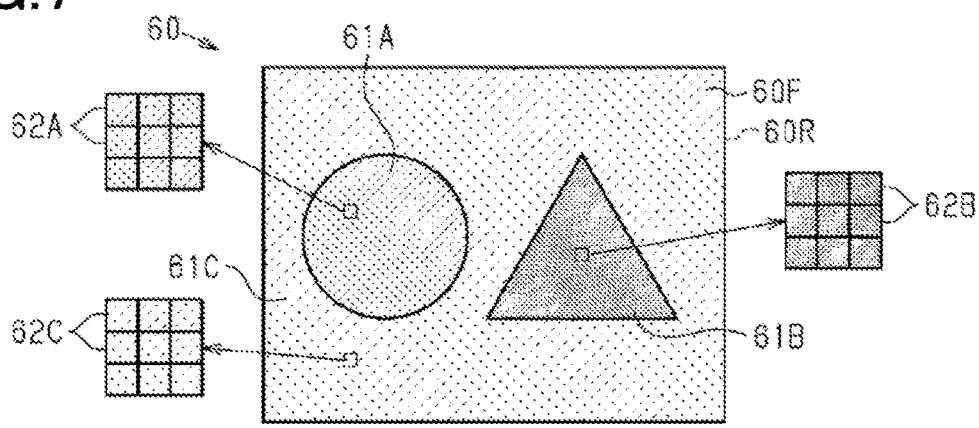
FIG. 7 is a diagram illustrating a planar structure of a display, which is an exemplary application of a wavelength selective filter according to the first embodiment.

As shown in FIG. 7, a display 60 has a front surface 60F and a rear surface 60R that is a surface opposite to the front surface 60F. The display 60 includes a first display region 61A, a second display region 61B, and a third display region 61C when viewed in a direction facing the front surface 60F. The first display region 61A is a region in which a plurality of first pixels 62A are arranged, the second display region 61B is a region in which a plurality of second pixels 62B are arranged, and a third display region 61C is a region in which a plurality of third pixels 62C are arranged. In other words, the first display region 61A is composed of a set of the plurality of first pixels 62A, the second display region 61B is composed of the plurality of second pixels 62B, and the third display region 61C is composed of the plurality of third pixels 62C.

Each of the first display region 61A, the second display region 61B, and the third display region 61C expresses characters, symbols, graphics, patterns, designs, backgrounds thereof, etc., singly or in combination of two or more of these regions. For example, in the configuration shown in FIG. 7, a circular graphic is expressed by the first display region 61A, a triangular graphic is expressed by the second display region 61B, and a background is expressed by the third display region 61C.

The configuration of the wavelength selective filter 10 is applied to each of the first pixel 62A, the second pixel 62B, and the third pixel 62C. In the pixels 62A, 62B, and 62C, the front surface of the wavelength selective filter 10 is on the front surface of the display 60 while the second direction and the third direction of the respective pixels 62A, 62B, and 62C are parallel to the front surface 60F of the display 60.

The wavelength ranges at which resonance occurs due to a guided-mode resonance phenomenon are different among the first pixel 62A, the second pixel 62B, and the third pixel 62C. The wavelength range at which resonance occurs in each of the pixels 62A, 62B, and 62C is set to a desired wavelength range by adjusting the period of the subwavelength gratings in the first grating region 13 and the second grating region 15 for each of the pixels 62A, 62B, and 62C. Therefore, when light including a plurality of wavelengths is incident, the wavelength range of reflected light emitted from the first pixel 62A, the wavelength range of reflected light emitted from the second pixel 62B, and the wavelength range of reflected light emitted from the third pixel 62C are different from each other. Further, when the above light is incident, the wavelength range of transmitted light emitted from the first pixel 62A, the wavelength range of transmitted light emitted from the second pixel 62B, and the wavelength range of transmitted light emitted from the third pixel 62C are different from each other.

Figure 8:
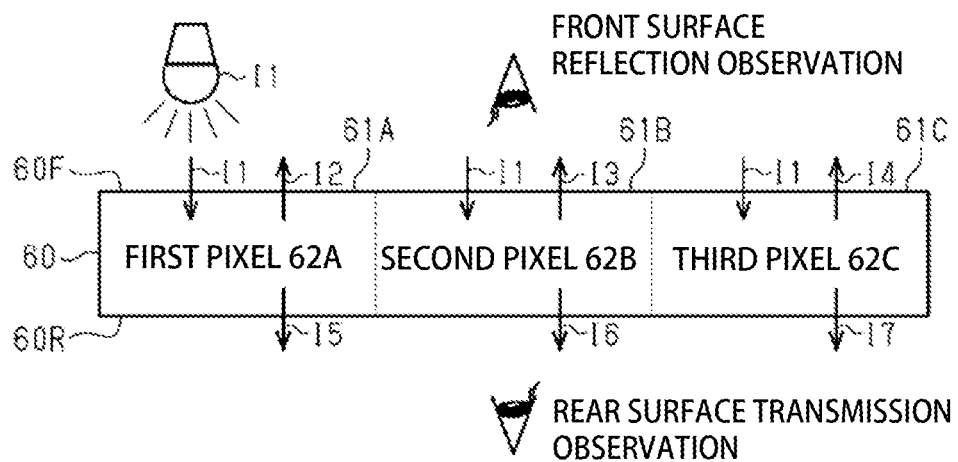
FIG. 8 is a diagram illustrating an effect of a display, which is an exemplary application of a wavelength selective filter according to the first embodiment.

That is, as shown in FIG. 8, when the front surface 60F of the display 60 is externally illuminated with incident light I1, reflected light I2 is emitted from the first pixel 62A, reflected light I3 is emitted from the second pixel 62B, and reflected light I4 is emitted from the third pixel 62C on the front surface of the display 60. Therefore, when the front surface 60F of the display 60 is viewed from the front side, the color with hue corresponding to the wavelength range of the reflected light I2 is observed in the first display region 61A, the color with hue corresponding to the wavelength range of the reflected light I3 is observed in the second display region 61B, and the color with hue corresponding to the wavelength range of the reflected light I4 is observed in the third display region 61C. Since the wavelength range of the reflected light I2, the wavelength range of the reflected light I3, and the wavelength range of the reflected light I4 are different from each other, the first display region 61A, the second display region 61B, and the third display region 61C appear in hues different from each other.

As a result, in front surface reflection observation, in which the front surface 60F is observed from the front side of the display 60 in a state in which the front surface 60F of the display 60 is externally illuminated with the incident light I1, an image including the first display region 61A, the second display region 61B, and the third display region 61C in colors different from each other is observed.

Further, when the front surface 60F of the display 60 is externally illuminated with the incident light I1, transmitted light I5 is emitted from the first pixel 62A, transmitted light I6 is emitted from the second pixel 62B, and transmitted light I7 is emitted from the third pixel 62C on the rear surface of the display 60. Therefore, when the rear surface 60R of the display 60 is viewed from the rear side, the color with hue corresponding to the wavelength range of the transmitted light I5 is observed in the first display region 61A, the color with hue corresponding to the wavelength range of the transmitted light I6 is observed in the second display region 61B, and the color with hue corresponding to the wavelength range of the transmitted light I7 is observed in the third display region 61C. Since the wavelength range of the transmitted light I5, the wavelength range of the transmitted light I6, and the wavelength range of the transmitted light I7 are different from each other, the first display region 61A, the second display region 61B, and the third display region 61C appear in hues different from each other.

As a result, in rear surface transmission observation, in which the rear surface 60R is observed from the rear side of the display 60 in a state in which the front surface 60F of the display 60 is externally illuminated with the incident light I1, an image including the first display region 61A, the second display region 61B, and the third display region 61C in colors different from each other is observed.

In addition, since the wavelength range of the reflected light I2 and the wavelength range of the transmitted light I5 are different from each other, a color that appears in the first display region 61A when the display 60 is viewed from the front side and a color that appears when the display 60 is viewed from the rear side are different in hue. The color that appears on the rear side is a color corresponding to a complementary color of the color that appears on the front side. Similarly, colors that appear in the second display region 61B and the third display region 61C when the display 60 is viewed from the front side and colors that appear when the display 60 is viewed from the rear side are different in hue.

Therefore, images having different colors are observed on the display 60 in front surface reflection observation and rear surface transmission observation. Accordingly, products having the display 60 can further improve resistance against counterfeiting and also improve designability. In addition, the front and back of the display 60 can be easily recognized.

As described above, since the wavelength selective filter 10 of the first embodiment has increased wavelength selectivity, the sharpness and brightness of colors observed in the display regions 61A, 61B, and 61C are increased due to the wavelength selective filter 10 being applied to the pixels 62A, 62B, and 62C. This increases the visibility of the image produced by the display 60. In addition, in the wavelength selective filter 10 of the first embodiment, a flexible substrate 11 such as a resin film can be used. Accordingly, a display 60 having high degree of freedom in shape can also be achieved.

Each of the substrate 11, the first low refractive index region 12, the first grating region 13, the intermediate region 14, the second grating region 15, the second low refractive index region 16, and the top region 17 is continuous among the first pixel 62A, the second pixel 62B, and the third pixel 62C. That is, the first pixel 62A, the second pixel 62B, and the third pixel 62C have a single common substrate 11, the concavo-convex structure layer 21 continuous among these pixels, the high refractive index layer 22 continuous among these pixels, and the low refractive index layer 23 continuous among these pixels.

The concavo-convex structure layers 21 for the first pixel 62A, the second pixel 62B, and the third pixel 62C can be simultaneously formed by, for example, a nanoimprinting method using a glass mold having different periods of concavo-convex structure for the portions corresponding to the pixels 62A, 62B, and 62C. Further, portions of the high refractive index layer 22 and the low refractive index layer 23 corresponding to the pixels 62A, 62B, and 62C can also be simultaneously formed. Therefore, the pixels 62A, 62B, and 62C developing different colors can be easily formed.

The number of display regions in the display 60, that is, the number of display regions in which pixels having the configuration of the wavelength selective filter 10 are arranged to develop colors with different hues, is not limited. The number of display regions may be one, or four or more. The display 60 may also include a region having a structure different from that of the wavelength selective filter 10, for example, a region in which only a flat layer made of a low refractive index material is laminated on the substrate 11.

Further, the display region may include a display element having the configuration of the wavelength selective filter 10. The display element is not limited to a pixel that is the minimum repeating unit for forming a raster image, and may be a region formed by connecting anchor points for forming a vector image.

According to the above first embodiment, the following advantageous effects can be obtained.

(1) Due to a guided-mode resonance phenomenon occurring in the first grating region 13 and the second grating region 15, light enhanced by the two grating regions 13 and 15 is obtained as reflected light. Accordingly, the intensity of light extracted as reflected light increases compared with a wavelength selective filter having only a single grating region. Further, since a low refractive index layer 23 having a surface shape following the concavo-convex structure on a surface of the high refractive index layer 22 is provided, it is possible to cancel light in a wavelength range different from the reflected light enhanced by the grating regions 13 and 15 by adjusting the thickness and refractive index of the low refractive index layer 23 to thereby prevent such light from being emitted together with the reflected light. Accordingly, the wavelength selectivity of the wavelength selective filter 10 can be increased.

(2) The concavo-convex structure layer 21 can be formed of polymers. The concavo-convex structure layer 21 can be formed of a UV-curable resin, a heat-curable resin, or a thermoplastic resin. The low refractive index layer 23 can be formed of an inorganic compound. Accordingly, the concavo-convex structure layer 21 can be formed by, for example, nanoimprinting, which is suitable for fabrication of a fine concavo-convex structure. The low refractive index layer 23 can be formed by, for example, physical vapor deposition when it is formed of an inorganic compound. Accordingly, the low refractive index layer 23 can be formed by a production method suitable for forming a shape following the concavo-convex structure of the underlying layer. Thus, the concavo-convex structure layer 21 and the low refractive index layer 23 can be suitably formed by using different low refractive index materials.

(3) The ratio of the optical film thickness OT2 of the second grating region 15 to the optical film thickness OT1 of the first grating region 13 is 0.5 or more and 2.0 or less, and more preferably 0.625 or more and 1.6 or less. Accordingly, light in close wavelength ranges enhanced by two grating regions 13 and 15 is obtained as reflected light. Therefore, the wavelength selectivity is further increased.

(4) The area ratio R3 of the intermediate high refractive index regions 14a in the intermediate region 14 satisfies R3≤R1+R2−1. Accordingly, the width of the intermediate high refractive index regions 14a is made small, and thus the average refractive index of the intermediate region 14 is prevented from excessively increasing. As a result, the average refractive indices of the grating regions 13 and 15 can be suitably different from that of the adjacent regions, and the intensities of reflected light obtained from the grating regions 13 and 15 using a guided-mode resonance phenomenon can be suitably obtained.

Further, when viewed in a direction parallel to the first direction, due to the second grating high refractive index regions 15a extending outside the intermediate high refractive index regions 14a, the width of the intermediate high refractive index regions 14a is prevented from increasing. Accordingly, the intensities of reflected light from the grating regions 13 and 15 can be suitably obtained in the same manner as described above.

(5) The wavelength selective filter 10 is formed by a step of forming the concavo-convex structure layer 21 made of a low refractive index material, a step of forming the high refractive index layer 22 on a surface of the concavo-convex structure layer 21, and a step of forming the low refractive index layer 23 on a surface of the high refractive index layer 22. According to this method, the wavelength selectivity of the wavelength selective filter 10 can be increased without requiring precise control of the film thickness of a layer in contact with the subwavelength grating. Therefore, the wavelength selective filter 10 can be easily produced.

(6) In the method of producing the concavo-convex structure layer 21 using a resin as a low refractive index material, and pressing an intaglio plate against a coating layer made of the resin to cure the resin, the concavo-convex structure layer 21 is formed by nano-imprinting. Accordingly, the concavo-convex structure layer 21 having fine concavo-convex structure can be suitably and easily produced. Further, in the method of producing the low refractive index layer 23 by physical vapor deposition, the low refractive index layer 23 having a surface shape following the concavo-convex structure of the surface of the high refractive index layer 22 can be suitably formed.

Further, when the high refractive index layer 22 is formed by physical vapor deposition, the high refractive index layer 22 is formed so that the second grating high refractive index regions 15a extend outside the intermediate high refractive index regions 14a when viewed in a direction parallel to the first direction. According to this method, while the intermediate high refractive index regions 14a are formed on the side surface of the protrusions 21a, the width of the intermediate high refractive index regions 14a can be made small. Accordingly, the intensities of reflected light from the grating regions 13 and 15 can be suitably obtained.

Second Embodiment

With reference to FIGS. 9 to 12, a second embodiment of a wavelength selective filter, a display, and a method of producing a wavelength selective filter will be described. The following description focuses on differences between the second embodiment and the first embodiment, and configurations which are the same as those of the first embodiment will be referred to by the same reference numbers and the description thereof will be omitted.

[Configuration of Wavelength Selective Filter]

Figure 9:
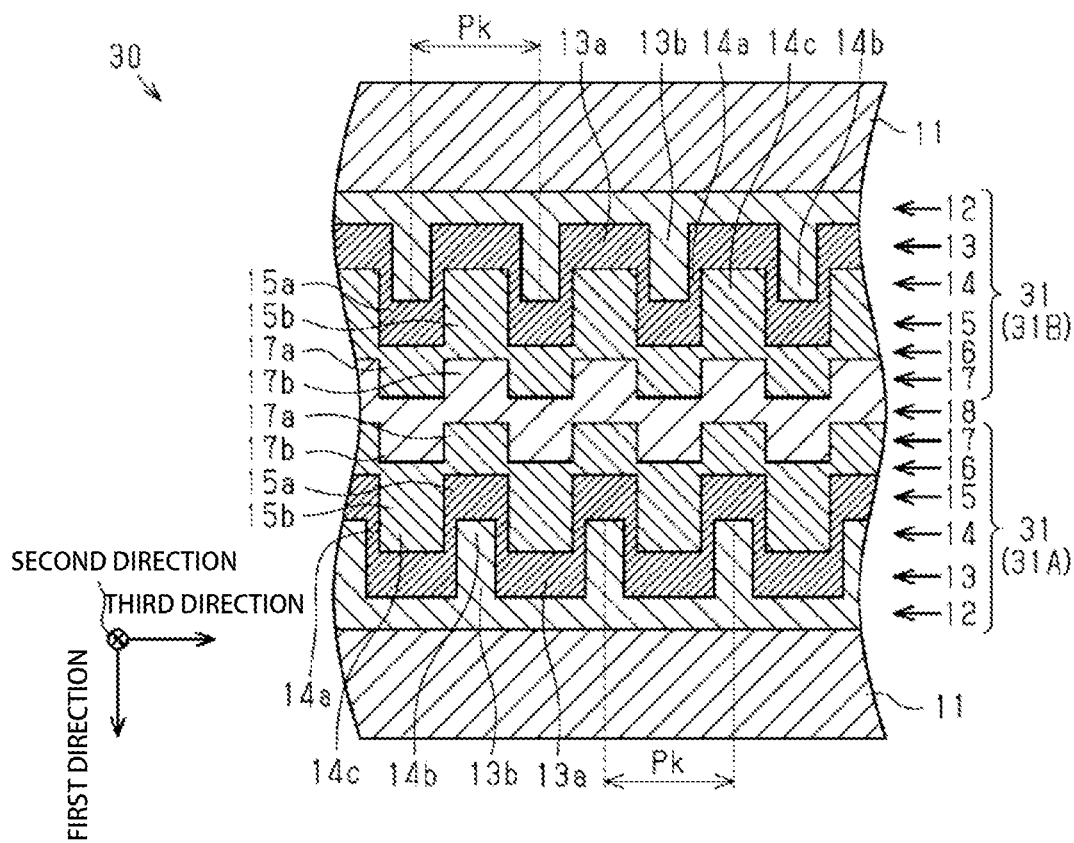
FIG. 9 is a diagram illustrating an example of a cross-sectional structure of a wavelength selective filter according to a second embodiment.
Figure 10:
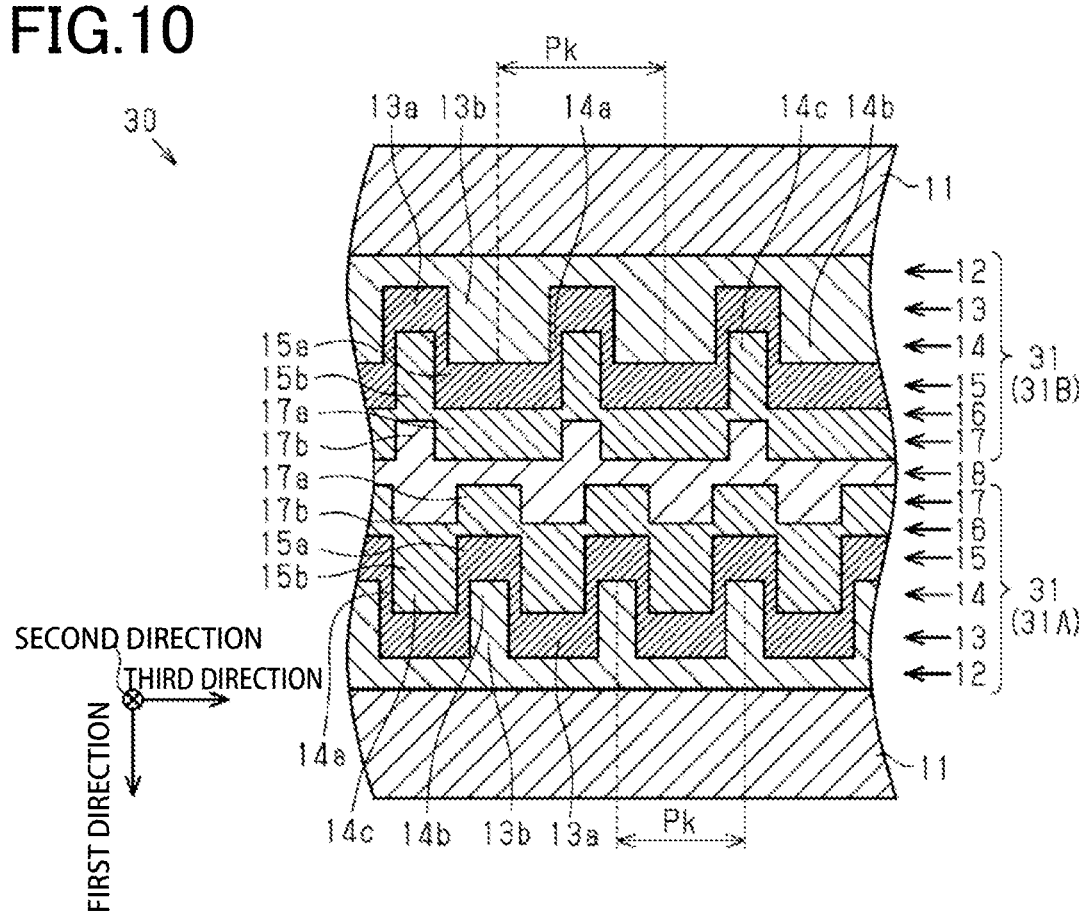
FIG. 10 is a diagram illustrating an example of a cross-sectional structure of a wavelength selective filter according to the second embodiment.

With reference to FIGS. 9 and 10, a configuration of the wavelength selective filter in the second embodiment will be described. As shown in FIG. 9, a wavelength selective filter 30 of the second embodiment includes two resonance structure portions 31. Each resonance structure portion 31 is a structure including the first low refractive index region 12, the first grating region 13, the intermediate region 14, the second grating region 15, the second low refractive index region 16, and the top region 17 described in the first embodiment. The second top low refractive index regions 17b in the top region 17 are filled with a low refractive index material.

Two resonance structure portions 31, composed of a first resonance structure portion 31A and a second resonance structure portion 31B, are adjacent to each other in the first direction. The two resonance structure portions 31A and 31B are sandwiched between two substrates 11. In other words, the wavelength selective filter 30 of the second embodiment has a structure in which two wavelength selective filters 10 of the first embodiment are joined to each other with the respective top regions 17 facing each other. That is, the wavelength selective filter 30 of the second embodiment has a structure in which four subwavelength gratings are arranged with an interval in the first direction, and these subwavelength gratings are embedded in a low refractive index material. In other words, the wavelength selective filter 30 includes two pairs of grating structures (grating pairs) having the same arrangement direction and arrangement period, and these grating structures are surrounded by a low refractive index material. These two grating pairs are arranged in the first direction. Further, a side of the wavelength selective filter 30 on which one of the substrates 11 is located is a front surface, and a side of the wavelength selective filter 30 on which the other of the substrates 11 is located is a rear surface.

In the wavelength selective filter 30, an extending direction of the grating high refractive index regions 13a and 15a and the grating low refractive index regions 13b and 15b which are grating elements in the first resonance structure portion 31A and an extending direction of the grating high refractive index regions 13a and 15a and the grating low refractive index regions 13b and 15b which are grating elements in the second resonance structure portion 31B coincide with each other. In other words, the arrangement direction of the subwavelength gratings in the first resonance structure portion 31A and the arrangement direction of the subwavelength gratings in the second resonance structure portion 31B coincide with each other. Further, the low refractive index regions and the high refractive index regions of the intermediate region 14 and the top region 17 in the respective resonance structure portions 31 also extend in the same direction as the grating elements.

Between the first resonance structure portion 31A and the second resonance structure portion 31B, a boundary low refractive index region 18 uniformly extends across the top region 17 of the first resonance structure portion 31A and the top region 17 of the second resonance structure portion 31B. The boundary low refractive index region 18 is continuous to the second top low refractive index regions 17b of the top region 17 in the first resonance structure portion 31A, and the second top low refractive index regions 17b of the top region 17 in the second resonance structure portion 31B. The boundary low refractive index region 18 and the second top low refractive index regions 17b of the respective resonance structure portions 31 are made of the same material.

A structural period Pk which is the arrangement period of the protrusions 21a in the first resonance structure portion 31A and a structural period Pk which is the arrangement period of the protrusions 21a in the second resonance structure portion 31B may be the same as shown in FIG. 9, or may be different as shown in FIG. 10. The structural period Pk coincides with the first period P1 in the first grating region 13.

In order to increase the wavelength selectivity in the first resonance structure portion 31A and the second resonance structure portion 31B, as in the first embodiment, the ratio of the optical film thickness OT2 of the second grating region 15 to the optical film thickness OT1 of the first grating region 13 is preferably 0.5 or more and 2.0 or less, and more preferably 0.625 or more and 1.6 or less.

[Effect of Wavelength Selective Filter]

When the two resonance structure portions 31A and 31B have the same structural period Pk, the variation in the wavelength range of light at which resonance occurs decreases in the four lattice regions 13 and 15 of the wavelength selection filter 30. Since reflected light in the wavelength range enhanced by each of four grating regions 13 and 15 is emitted from the front surface of the wavelength selective filter 30, the intensity of reflected light in the specific wavelength range further increases, and thus the wavelength range of the reflected light further increases compared with the wavelength selective filter 10 of the first embodiment. When the ratio of the optical film thickness OT2 to the optical film thickness OT1 is the same between the first resonance structure portion 31A and the second resonance structure portion 31B, variation in optical film thickness among four grating regions 13 and 15 decreases. This is preferable in that the wavelength ranges of light at which resonance occurs in the grating regions 13 and 15 become closer.

On the other hand, when two resonance structure portions 31A and 31B have structural periods Pk different from each other, the wavelength range of light at which resonance occurs in the grating regions 13 and 15 in the first resonance structure portion 31A, and the wavelength range of light at which resonance occurs in the grating regions 13 and 15 in the second resonance structure portion 31B are different from each other. As a result, light in a wavelength range enhanced by the grating regions 13 and 15 in the first resonance structure portion 31A and light in a wavelength range enhanced by the grating regions 13 and 15 in the second resonance structure portion 31B are emitted from the front surface of the wavelength selective filter 30.

Regardless of whether the structural periods Pk of two resonance structure portions 31A and 31B are the same, the top region 17 cancels light (non-target light) in a wavelength range different from the wavelength range desired to be extracted from light due to reflection and interference on the rear side of the top region 17, as in the first embodiment, to thereby prevent non-target light from being emitted from the front surface of the wavelength selective filter 30. That is, the thickness and the material of the low refractive index layer 23 and the material of the boundary low refractive index region 18 are selected so that emission of light in a wavelength range other than that enhanced by the grating regions 13 and 15 can be cancelled by the top region 17.

Further, among light incident on the wavelength selective filter 30, light that has been transmitted through the respective regions is emitted from the rear surface of the wavelength selective filter 30. Since the wavelength selective filter 30 of the second embodiment includes a plurality of resonance structure portions 31, each having two grating regions 13 and 15, the degree of freedom in adjustment of hue observed as reflected light or transmitted light can be increased.

[Exemplary Application of Wavelength Selective Filter]

As in the exemplary application described in the first embodiment, the wavelength selective filter 30 of the second embodiment may be applied to filters used for devices that perform color conversion or color separation of light, or may be applied to display elements of the display 60.

For example, when a configuration in which two resonance structure portions 31A and 31B have the same structural period Pk is applied, the sharpness and brightness of colors observed in the display regions 61A, 61B, and 61C in the display 60 by front surface reflection observation are increased, and thus the visibility of the image is increased.

Further, for example, when a configuration in which two resonance structure portions 31A and 31B have different structural periods Pk is applied, the degree of freedom in adjustment of hue of the image observed in the display 60 by front surface reflection observation and rear surface transmission observation is increased. Specifically, the above adjustment of hue can be performed by varying a combination of the structural period Pk of the first resonance structure portion 31A and the structural period Pk of the second resonance structure portion 31B in the first pixel 62A, the second pixel 62B, and the third pixel 62C.

[Method of Producing Wavelength Selective Filter]

Figure 11:
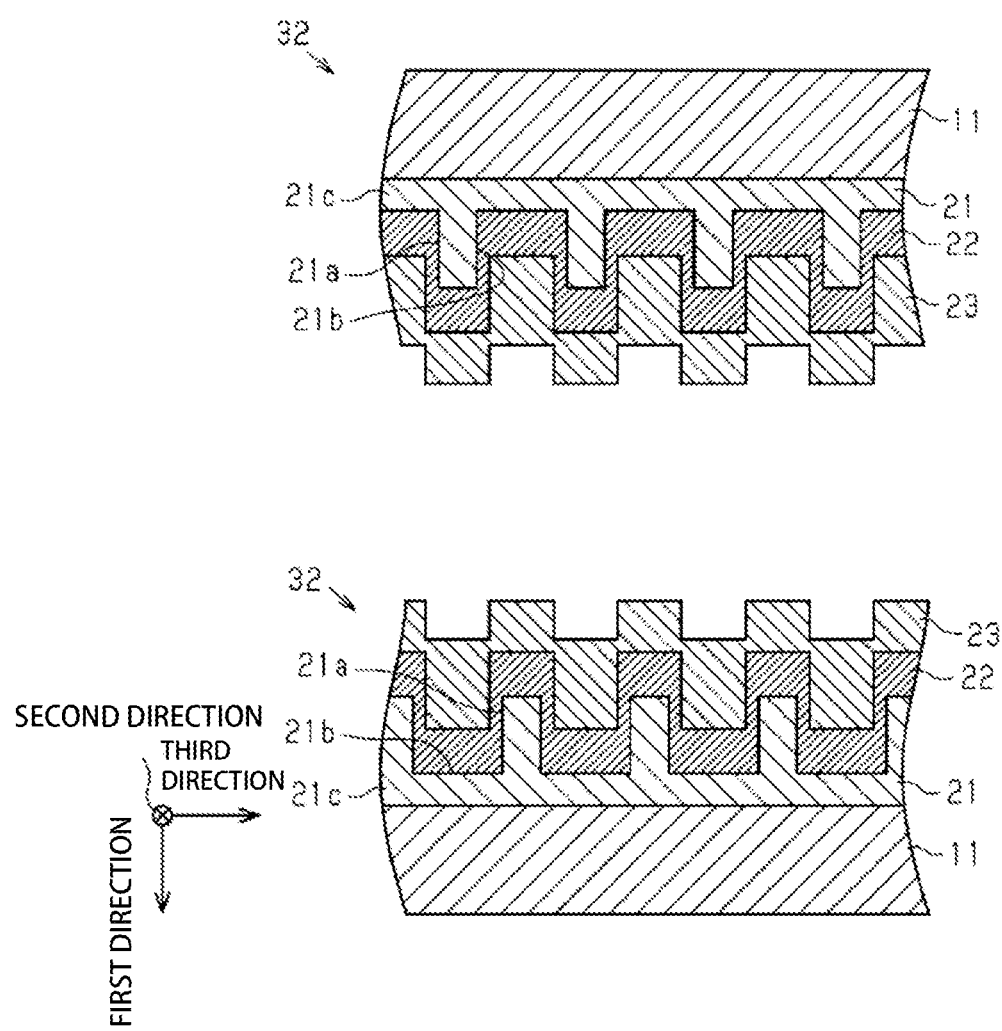
FIG. 11 is a diagram illustrating a state in which concavo-convex structure bodies are provided facing each other in a method of producing a wavelength selective filter according to the second embodiment.
Figure 12:
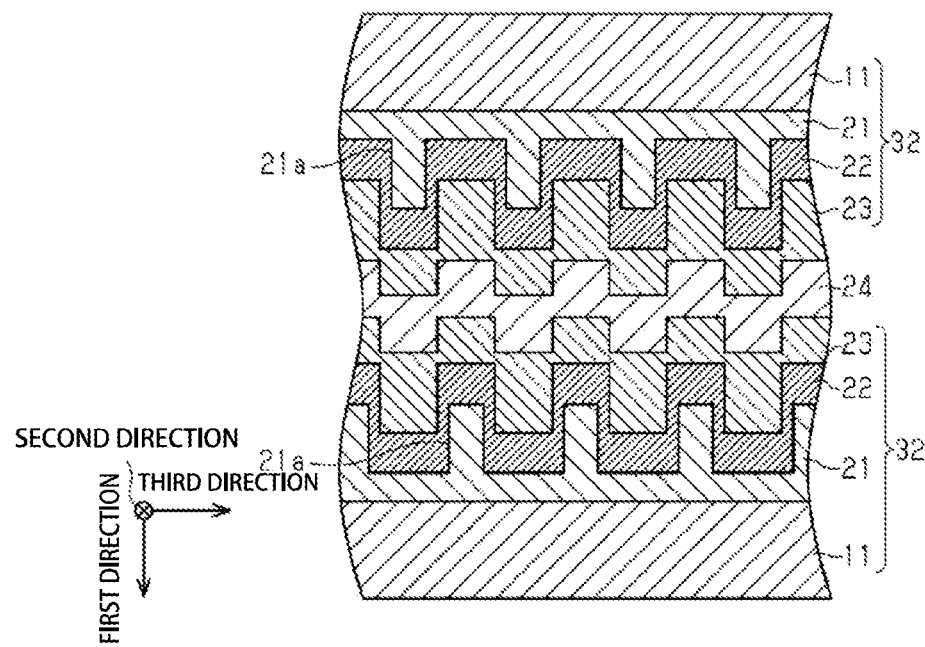
FIG. 12 is a diagram illustrating a step of forming an embedded layer in a method of producing a wavelength selective filter according to the second embodiment.

With reference to FIGS. 11 and 12, a method of producing the wavelength selective filter 30 of the second embodiment will be described. First, as in the first embodiment, in production of the wavelength selective filter 30 of the second embodiment, the concavo-convex structure layer 21, the high refractive index layer 22, and the low refractive index layer 23 are formed in sequence on the substrate 11.

Subsequently, as shown in FIG. 11, two concavo-convex structure bodies 32, which are structures each including the substrate 11, the concavo-convex structure layer 21, the high refractive index layer 22, and the low refractive index layer 23, are disposed with the low refractive index layers 23 facing each other. Then, as shown in FIG. 12, these concavo-convex structure bodies 32 are joined to each other by filling a region between two concavo-convex structure bodies 32 with a low refractive index material (third low refractive index material). Thus, the wavelength selective filter 30 is formed.

As shown in FIG. 12, a portion formed by the low refractive index material embedded in a region between two concavo-convex structure bodies 32 is an embedded layer 24. The embedded layer 24 is composed of the second top low refractive index regions 17b of the top region 17 in the first resonance structure portion 31A, the second top low refractive index regions 17b of the top region 17 in the second resonance structure portion 31B, and the boundary low refractive index region 18.

The low refractive index material constituting the embedded layer 24 is preferably a material having a refractive index lower than that of the high refractive index material constituting the high refractive index layer 22. Preferably, a resin material such as a UV-curable resin, a thermoplastic resin, or a heat-curable resin is used. For example, the embedded layer 24 may be made of the same material as that of the concavo-convex structure layer 21. Various coating methods may be used to form the embedded layer 24.

In a state in which two concavo-convex structure bodies 32 face each other, the respective first top low refractive index regions 17a may face each other, or the first top low refractive index regions 17a in one of the concavo-convex structure bodies 32 may face the second top low refractive index regions 17b in the other of the concavo-convex structure bodies 32. Alternatively, the first top low refractive index regions 17a in one of the concavo-convex structure bodies 32 may face part of the first top low refractive index regions 17a and part of the second top low refractive index regions 17b in the other of the concavo-convex structure bodies 32.

For example, by joining two concavo-convex structure bodies 32 having the same period of the protrusions 21a, the wavelength selective filter 30 in which two resonance structure portions 31A and 31B have the same structural period Pk can be formed. Alternatively, for example, by joining two concavo-convex structure bodies 32 having different periods of the protrusions 21a, the wavelength selective filter 30 in which two resonance structure portions 31A and 31B have structural periods Pk different from each other can be formed.

Two resonance structure portions 31A and 31B may be disposed with the respective top regions 17 facing outward, instead of facing each other. That is, two concavo-convex structure bodies 32 may be joined to each other via the low refractive index material with the respective substrates 11 facing each other.

Moreover, two resonance structure portions 31A and 31B may be disposed with the top regions 17 of the resonance structure portions 31A and 31B both being oriented toward the front surface. That is, two concavo-convex structure bodies 32 may be joined to each other via the low refractive index material with the top region 17 of one of the concavo-convex structure bodies 32 facing the substrate 11 of the other of the concavo-convex structure bodies 32.

When the top region 17 is located on the outermost surface of the wavelength selective filter 30, the effect of reducing front surface reflection by the top region 17 can be obtained as in the first embodiment.

Furthermore, the wavelength selective filter 30 may include three or more resonance structure portions 31 arranged in the first direction. In a configuration in which the wavelength selective filter 30 includes a plurality of resonance structure portions 31 having the same structural period Pk, the intensity of reflected light increases as the number of resonance structure portions 31 increases. Further, the plurality of resonance structure portions 31 may include a plurality of resonance structure portions 31 having the same structural period Pk and a plurality of resonance structure portions 31 having different structural periods Pk. According to this configuration, color of reflected light and transmitted light emitted from the wavelength selective filter 30 can be finely adjusted.

In production of the wavelength selective filter 30 having three or more resonance structure portions 31, the substrate 11 may be made of a material detachable from the concavo-convex structure layer 21 and the substrate 11 may be removed when the concavo-convex structure body 32 is laminated. For example, after two concavo-convex structure bodies 32 are joined to each other via a low refractive index material with the respective top regions 17 facing each other, one of the substrates 11 is removed, and an exposed concavo-convex structure layer 21 is further joined to another concavo-convex structure body 32 via a low refractive index material. By repeating this procedure, a wavelength selective filter 30 having six or more subwavelength gratings is formed.

According to the second embodiment, the following advantageous effects can be obtained in addition to the advantageous effects (1) to (6) of the first embodiment.

(7) Since the wavelength selective filter 30 includes a plurality of resonance structure portions 31 arranged in the first direction, the wavelength selective filter 10 includes four or more grating regions 13 and 15. Accordingly, the wavelength selectivity of the wavelength selective filter 30 can be further increased, and the degree of freedom in adjustment of the wavelength range of reflected light and transmitted light can be increased.

(8) When the plurality of resonance structure portions 31 have the same structural period Pk, variation in wavelength range of light at which resonance occurs in the grating regions 13 and 15 in the resonance structure portions 31 decreases. Therefore, the wavelength selectivity for reflected light is further increased.

(9) When the ratio of the optical film thickness OT2 to the optical film thickness OT1 is the same between the first resonance structure portion 31A and the second resonance structure portion 31B, variation in optical film thickness among four grating regions 13 and 15 decreases, that is, the wavelength ranges of light at which resonance occurs in the grating regions 13 and 15 become closer. Therefore, the wavelength selectivity for reflected light is further increased.

(10) When the structural period Pk of the first resonance structure portion 31A and the structural period Pk of the second resonance structure portion 31B are different from each other, the wavelength range of light at which resonance occurs in the grating regions 13 and 15 in the first resonance structure portion 31A and the wavelength range of light at which resonance occurs in the grating regions 13 and 15 in the second resonance structure portion 31B are different from each other. Therefore, in the wavelength selective filter 30, it is possible to expand the wavelength range of the reflected light while increasing the intensity of reflected light, and narrow the wavelength range of transmitted light. Therefore, the degree of freedom in adjustment of hue observed as reflected light or transmitted light can be increased.

(11) The wavelength selective filter 30 is formed by providing two concavo-convex structure bodies 32 facing each other, and filling a region between two concavo-convex structure bodies 32 with a low refractive index material. Thus, the wavelength selective filter 30 having a plurality of resonance structure portions 31 can be easily formed.

Third Embodiment

Figure 13:
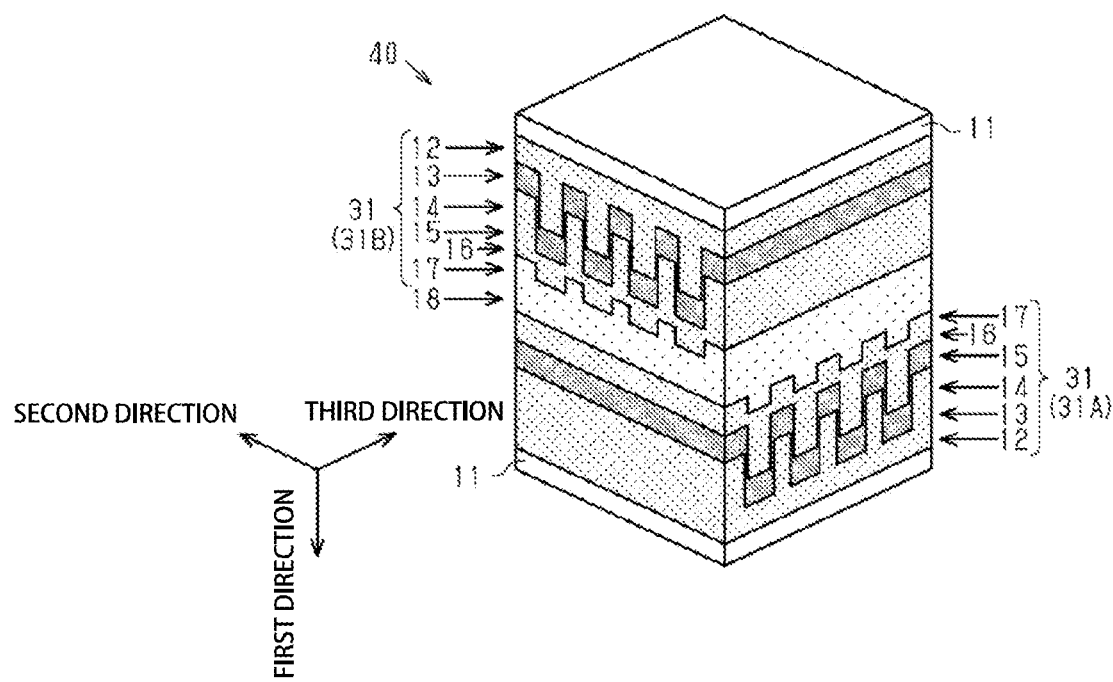
FIG. 13 is a diagram illustrating a perspective structure of a wavelength selective filter according to a third embodiment.

With reference to FIG. 13, a third embodiment of a wavelength selective filter, a display, and a method of producing a wavelength selective filter will be described. The third embodiment differs from the second embodiment in the arrangement direction of the subwavelength gratings in two resonance structure portions. The following description focuses on differences between the third embodiment and the second embodiment, and configurations which are the same as those of the second embodiment will be referred to by the same reference numbers and the description thereof will be omitted. Further, FIG. 13 is a diagram illustrating a part of the wavelength selective filter, in which each of the concavo-convex structure layer 21, the high refractive index layer 22, the low refractive index layer 23, and the embedded layer 24 are illustrated with dots of different densities in order to facilitate understanding of the structure of the wavelength selective filter.

[Configuration of Wavelength Selective Filter]

As shown in FIG. 13, as in the second embodiment, a wavelength selective filter 40 of the third embodiment includes two resonance structure portions 31A and 31B adjacent to each other in the first direction. In the third embodiment, an extending direction of the grating elements of the grating regions 13 and 15, that is, the grating high refractive index regions 13a and 15a and the grating low refractive index regions 13b and 15b in the first resonance structure portion 31A and an extending direction of the grating elements of the grating regions 13 and 15 in the second resonance structure portion 31B are different from each other. That is, the arrangement direction of the subwavelength gratings in the first resonance structure portion 31A and the arrangement direction of the subwavelength gratings in the second resonance structure portion 31B are different from each other.

The structural period Pk which is the arrangement period of the protrusions 21a in the first resonance structure portion 31A and the structural period Pk which is the arrangement period of the protrusions 21a in the second resonance structure portion 31B are the same. In order to increase the wavelength selectivity for reflected light, in the first resonance structure portion 31A and the second resonance structure portion 31B, the ratio of the optical film thickness OT2 of the second grating region 15 to the optical film thickness OT1 of the first grating region 13 is preferably 0.5 or more and 2.0 or less, and more preferably 0.625 or more and 1.6 or less. Further, the above ratio is preferably the same between the first resonance structure portion 31A and the second resonance structure portion 31B.

The grating high refractive index regions 13a and 15a and the grating low refractive index regions 13b and 15b in the first resonance structure portion 31A extend in the second direction and are arranged in the third direction. On the other hand, the grating high refractive index regions 13a and 15a and the grating low refractive index regions 13b and 15b in the second resonance structure portion 31B extend in the third direction and are arranged in the second direction. That is, the extending direction of the grating elements in the first resonance structure portion 31A and the extending direction of the grating elements in the second resonance structure portion 31B are perpendicular to each other. In other words, an angle formed between the arrangement direction of the subwavelength gratings in the first resonance structure portion 31A and the arrangement direction of the subwavelength gratings in the second resonance structure portion 31B is 90°.

[Effect of Wavelength Selective Filter]

As described above, when the subwavelength grating is composed of the grating high refractive index regions 13a and 15a having a strip shape extending in one direction, light polarized in a specific direction propagates with multiple reflections in the grating regions 13 and 15, causing resonance so that the light is emitted as reflected light. The above specific direction depends on the arrangement direction of the subwavelength grating. Since the arrangement directions of the subwavelength grating are different between the first resonance structure portion 31A and the second resonance structure portion 31B, the polarization direction of light propagating with multiple reflections in the grating regions 13 and 15 in the first resonance structure portion 31A and the polarization direction of light propagating with multiple reflections in the grating regions 13 and 15 in the second resonance structure portion 31B are different from each other. Therefore, according to the wavelength selective filter 40 of the third embodiment, reflected light is efficiently emitted in response to incident light including polarization components into various directions, and thus the intensity of reflected light is further increased.

As in the exemplary application described in the first embodiment, the configuration of the wavelength selective filter 40 of the third embodiment may be applied to filters used for devices that perform color conversion or color separation of light, or may be applied to display elements of the display 60. Incident light on the display 60 is typically light including polarization components in various directions, such as general illumination or sunlight. Therefore, when the wavelength selective filter 40 of the third embodiment is applied to the display 60, it is effective in that reflected light is efficiently emitted depending on polarization. On the other hand, when incident light has a uniform polarization direction, the wavelength selective filter 30 according to the second embodiment is preferably applied.

[Method of Producing Wavelength Selective Filter]

As in the second embodiment, the wavelength selective filter 40 of the third embodiment is formed by providing two concavo-convex structure bodies 32 with the respective top regions 17 facing each other, and filling a region between the two concavo-convex structure bodies 32 with a low refractive index material (third low refractive index material). In the third embodiment, the concavo-convex structure bodies 32 facing each other are joined to each other via the low refractive index material such that an extending direction of the protrusions 21a in one of the concavo-convex structure bodies 32 is perpendicular to an extending direction of the protrusions 21a in the other of the concavo-convex structure bodies 32.

Further, as in the second embodiment, two resonance structure portions 31A and 31B may be disposed with the respective top regions 17 facing outward, or the top regions 17 of the resonance structure portions 31A and 31B both being oriented toward the front surface.

The arrangement directions of the subwavelength gratings in two resonance structure portions 31A and 31B may not necessarily be perpendicular to each other, but may be different from each other. The arrangement directions of the subwavelength gratings can be set to adjust the polarization response of the wavelength selective filter 40.

Furthermore, the wavelength selective filter 40 may include three or more resonance structure portions 31 arranged in the first direction, and the plurality of resonance structure portions 31 may include resonance structure portions 31 in which the extending directions of the grating elements are different from each other. The wavelength selective filter 40 includes an even number of, that is, 2n (n is an integer, 3 or higher) subwavelength gratings, and the (2m−1)th (m is an integer, 1 or higher and n or less) subwavelength grating and 2m-th subwavelength grating from the front surface or the rear surface have the same arrangement direction and the same arrangement period of the gratings.

According to this configuration, the arrangement direction of the subwavelength grating can be set for each resonance structure portion 31, or the number of resonance structure portions 31 having the same arrangement direction of the subwavelength grating can be set to adjust the polarization response of the wavelength selective filter 40. Further, the plurality of resonance structure portions 31 may include resonance structure portions 31 in which the arrangement periods of the subwavelength gratings are different from each other.

According to the third embodiment, the following advantageous effects can be obtained in addition to the advantageous effects (1) to (6) of the first embodiment and (7) to (9) and (11) of the second embodiment.

(12) Since the extending direction of the grating elements in the first resonance structure portion 31A and the extending direction of the grating elements in the second resonance structure portion 31B are different from each other, light polarized in different directions from among the incident light causes resonance in the grating regions 13 and 15 of the first resonance structure portion 31A and in the grating regions 13 and 15 of the second resonance structure portion 31B, whereby light is emitted from the respective resonance structure portions 31. Therefore, reflected light is efficiently emitted in response to incident light including polarization components into various directions, and thus the intensity of reflected light is further increased.

Fourth Embodiment

Figure 14:
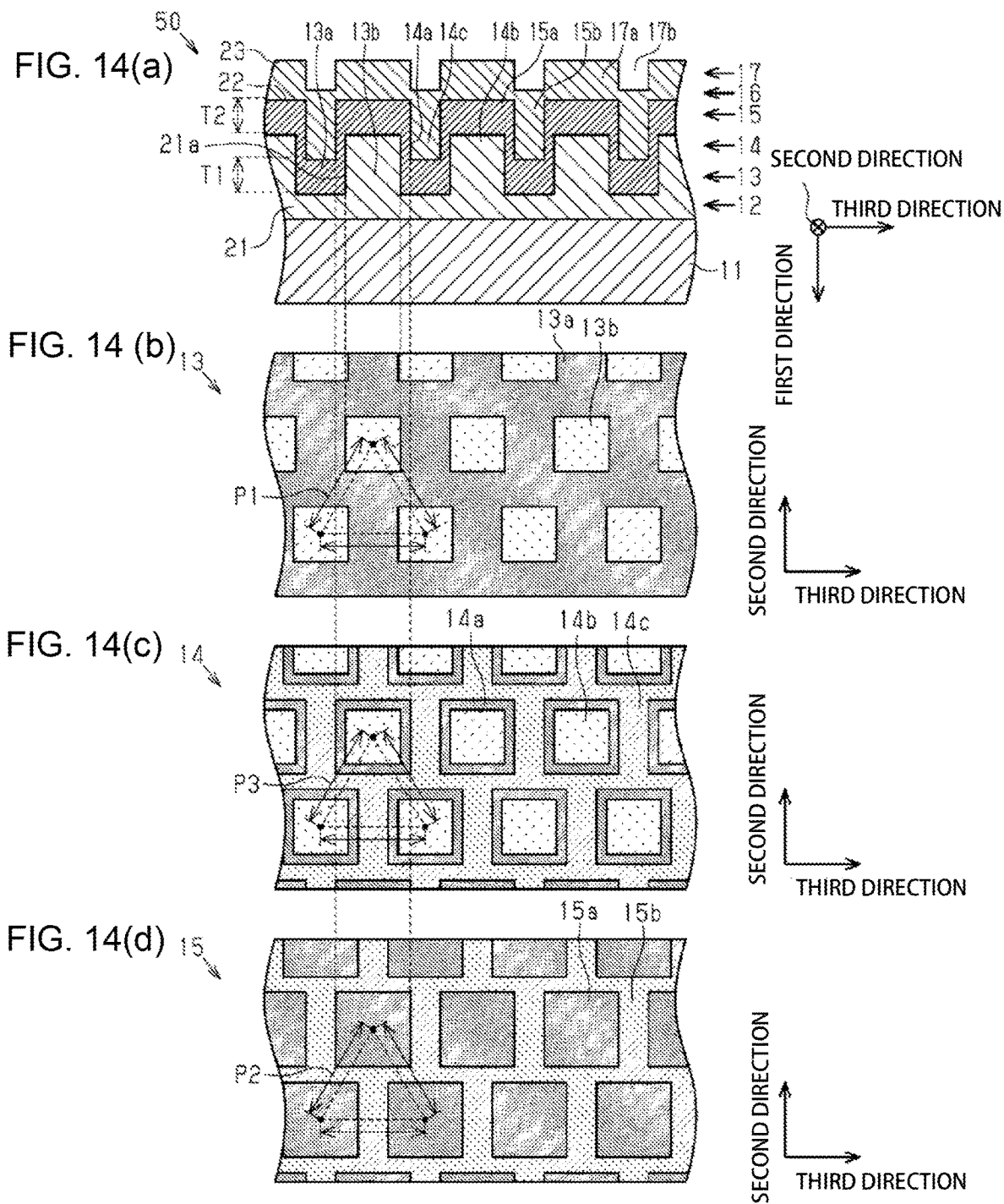

With reference to FIG. 14, a fourth embodiment of a wavelength selective filter, a display, and a method of producing a wavelength selective filter will be described. The fourth embodiment differs from the first embodiment in arrangement of the subwavelength grating. The following description focuses on differences between the fourth embodiment and the first embodiment, and configurations which are the same as those of the first embodiment will be referred to by the same reference numbers and the description thereof will be omitted.

As shown in FIGS. 14(*a*) to 14(*d*), a wavelength selective filter 50 of the fourth embodiment includes a subwavelength grating having an arrangement of two-dimensional grating pattern.

Specifically, as shown in FIG. 14(*b*) 4, a plurality of first grating low refractive index regions 13*b* are arranged in a two-dimensional grating pattern in the first grating region 13. The type of two-dimensional gratings is not specifically limited as long as first grating low refractive index regions 13*b* are located on grating points in the grating formed by two groups of parallel lines extending in directions different from each other. For example, the two-dimensional grating formed by first grating low refractive index regions 13*b* may be a square grating or a hexagonal grating. A first period P1, which is a period of grating structure in the first grating region 13, is constant among the respective extending directions in the two-dimensional grating. The first grating high refractive index regions 13*a* fill a region between the plurality of first grating low refractive index regions 13*b*, and form one continuous high refractive index region.

The shape of the first grating low refractive index regions 13*b* viewed in a direction parallel to the first direction is not specifically limited. For example, when the first grating low refractive index regions 13*b* are square, setting of an area ratio that defines the average refractive index of the first grating region 13 is easy.

As shown in FIG. 14(*c*), a plurality of first intermediate low refractive index regions 14*b* in the intermediate region 14 are arranged in the same two-dimensional grating pattern as the first grating low refractive index regions 13*b*. A third period P3, which is an arrangement period of the first intermediate low refractive index regions 14*b* in the intermediate region 14, coincides with the first period P1 in the first grating region 13. When viewed in a direction parallel to the first direction, the size of the first intermediate low refractive index region 14*b* coincides with the size of the first grating low refractive index region 13*b*.

When viewed in a direction parallel to the first direction, the intermediate high refractive index regions 14*a* have a frame shape, each surrounding a respective first intermediate low refractive index region 14*b*. The second intermediate low refractive index regions 14*c* fill a region between the intermediate high refractive index regions 14*a* adjacent to each other, and form one continuous low refractive index region.

As shown in FIG. 14(*d*), a plurality of second grating high refractive index regions 15*a* in the second grating region 15 are arranged in the same two-dimensional grating pattern as the first grating low refractive index regions 13*b*. The second grating low refractive index regions 15*b* fill a region between the plurality of second grating high refractive index regions 15*a*, and form one continuous low refractive index region. The second period P2, which is a period of grating structure in the second grating region 15, coincides with the first period P1 in the first grating region 13.

When viewed in a direction parallel to the first direction, the second grating high refractive index regions 15*a* distributed in the second grating region 15 are larger in size than the first grating low refractive index regions 13*b* distributed in the first grating region 13. In other words, the width of the second grating high refractive index regions 15*a* in each of the second direction and the third direction is larger than the width of the first grating low refractive index regions 13*b*. Accordingly, the width of the second grating low refractive index regions 15*b* is smaller than the width of the first grating high refractive index regions 13*a*. When viewed in a direction parallel to the first direction, the second grating high refractive index regions 15*a* have a shape similar to that of the first grating low refractive index regions 13*b*.

Further, in the top region 17, a plurality of first top low refractive index regions 17*a* are arranged in the same two-dimensional grating pattern as the first grating low refractive index regions 13*b*. The second top low refractive index regions 17*b* fill a region between the plurality of first top low refractive index regions 17*a*, and form one continuous low refractive index region. An arrangement period of the first top low refractive index regions 17*a* in the top region 17 coincides with the first period P1 in the first grating region 13.

In the wavelength selective filter 50 of the fourth embodiment, a guided-mode resonance phenomenon occurs due to the same principle as in the first embodiment, and light in the wavelength range enhanced by the first grating region 13 and light in the wavelength range enhanced by the second grating region 15 are extracted as reflected light. In the fourth embodiment, the optical film thickness OT1 of the first grating region 13 is obtained by the formula (2) shown in the first embodiment, and the optical film thickness OT2 of the second grating region 15 is obtained by the formula (4) shown in the first embodiment. When the ratio of the optical film thickness OT2 of the second grating region 15 to the optical film thickness OT1 of the first grating region 13 is 0.5 or more and 2.0 or less, and more preferably 0.625 or more and 1.6 or less, favorable wavelength selectivity for reflected light is obtained in the wavelength selective filter 50.

Furthermore, in the fourth embodiment, the formula (5) shown in the first embodiment is preferably satisfied for the area ratio R3 of the intermediate high refractive index regions 14*a*. When the formula (5) is satisfied, the width of the intermediate high refractive index regions 14a is prevented from extending outside the second grating high refractive index regions 15a, and thus the area ratio of the intermediate high refractive index regions 14a is prevented from being excessively large. This improves the intensity of light reflected from the grating regions 13 and 15.

Due to the grating elements constituting the subwavelength grating in the fourth embodiment being arranged in a two-dimensional grating pattern, light polarized in different directions can undergo resonance in each arrangement direction of the grating elements. Therefore, compared with the first embodiment in which the grating elements are arranged in one direction, reflected light is efficiently emitted in response to incident light including polarization components into various directions. Accordingly, the intensity of reflected light is further increased.

In particular, when the grating elements are arranged in a hexagonal grating pattern, the number of polarization directions of light that can undergo resonance in the grating region increases compared with a case where the grating elements are arrange in a square grating pattern. Accordingly, reflected light can be further efficiently emitted in response to incident light including polarization components into various directions.

The wavelength selective filter 50 of the fourth embodiment can be produced by modifying the arrangement of the protrusions 21a in the method of producing the wavelength selective filter 10 of the first embodiment. Specifically, the concavo-convex structure layer 21 is formed by forming a concavo-convex structure in which a plurality of protrusions 21a are arranged in a two-dimensional grating pattern. The plurality of protrusions 21a are separated from each other, and the recesses 21b located between the protrusions 21a form one continuous recess. In the fourth embodiment in which the protrusions 21a are arranged in a two-dimensional grating pattern, a degree of freedom in size and arrangement of the protrusions 21a is high. Accordingly, fine adjustment can be performed in setting of the area ratio between the protrusions 21a and the recesses 21b.

Configurations of modifications of the wavelength selective filter 10 of the first embodiment can be applied to the wavelength selective filter 50 of the fourth embodiment. Further, as in the exemplary application described in the first embodiment, the configuration of the wavelength selective filter 50 of the fourth embodiment may be applied to filters used for devices that perform color conversion or color separation of light, or may be applied to display elements of the display 60.

Moreover, the wavelength selective filter 50 of the fourth embodiment may be applied to the configuration of the second embodiment and third embodiment. That is, a plurality of wavelength selective filters 50 may be laminated in the first direction to form a wavelength selective filter having four or more grating regions. In this case, a direction in which the grating elements constituting the subwavelength grating are arranged, in other words, an extending direction of the two-dimensional grating, may be the same or different between two or more resonance structure portions 31. When the extending directions of the two-dimensional grating in two resonance structure portions 31 are different from each other, the number of directions in which reflected light is emitted with polarization can be increased.

In each of the grating regions 13 and 15, the period of grating structure may be different among the extending directions of the two-dimensional grating. With this configuration, the wavelength range at which resonance occurs may be different among the extending directions of the two-dimensional grating to thereby adjust the wavelength range included in the reflected light and response to polarization.

Furthermore, the concavo-convex structure of the concavo-convex structure layer 21 may be formed of a plurality of recesses and a single protrusion which is continuous among these recesses. That is, the concavo-convex structure of the concavo-convex structure layer 21 may be formed of a plurality of concavo-convex elements including protrusions and recesses, which are arranged in a two-dimensional grating pattern with an interval.

According to the fourth embodiment, the following advantageous effects can be obtained in addition to the advantageous effects (1) to (6) of the first embodiment.

(13) Since the grating elements constituting the subwavelength grating are arranged in a two-dimensional grating pattern, reflected light is efficiently emitted in response to incident light including polarization components into various directions. Accordingly, the intensity of reflected light is further increased.

Modifications of First to Fourth Embodiments

The first to fourth embodiments can be modified and implemented as described below.

In the above embodiments, the intermediate region 14 of the wavelength selective filter may not necessarily include the intermediate high refractive index regions 14a. That is, the intermediate region 14 may be formed of the first intermediate low refractive index regions 14b and the second intermediate low refractive index regions 14c. Depending on the production conditions of the high refractive index layer 22, the wavelength selective filter having no intermediate high refractive index region 14a, that is, the wavelength selective filter in which the high refractive index layer 22 is not formed on the side surface of the protrusions 21a can be produced.

In a configuration in which the top region 17 is on the outermost surface, a protective layer that covers the top region 17 may be provided. In this case, the protective layer is made of a low refractive index material such as resin, and the recesses of the low refractive index layer 23 are filled with the protective layer. That is, the second top low refractive index regions 17b are filled with a low refractive index material.

Fifth Embodiment

With reference to FIGS. 15 to 22, a fifth embodiment will be described. The fifth embodiment is an embodiment of an optical device having a wavelength selective filter. The same elements as those in the first to fourth embodiments are denoted by the same reference signs, and the description thereof is omitted.

An imaging element such as an image sensor separates incident light into three color components of red, green, and blue to detect the intensity of light of each color by a light receiving element. Then, the imaging element generates color image data based on the outputs from a plurality of light receiving elements arranged on a light receiving surface. The separation of incident light is performed using a color filter having a region transmitting red light, a region transmitting green light, and a region transmitting blue light (for example, see JP 2019-68049 A).

With the recent increasing demand for sensors capable of fine color reproduction, filters that prevent light in wavelength ranges of unwanted colors from being included in the transmitted light, that is, filters having high wavelength selectivity are desired. However, in conventional color filters, respective color regions are configured to absorb light using dye such as pigment to thereby transmit a relatively large amount of light in a specific wavelength range. Such filters have limitations in improvement of wavelength selectivity. Therefore, it is desired to develop filters capable of selecting light with high accuracy by using a principle different from that of filters using dye.

It should be noted that the above issues are not limited to imaging elements that generate color image data, but are common to filters provided in devices that detect light extracted from incident light.

An object of the fifth embodiment is to provide an optical device capable of selecting light with high accuracy.

An optical device of the fifth embodiment will be described below. An optical device is used for a photodetector that detects light extracted from incident light. The wavelength range of incident light is not specifically limited. For example, incident light may be light in the visible region. In the following description, the wavelength of light in the visible region is 400 nm or more and 800 nm or less.

[Configuration of Optical Device]

Figure 15:
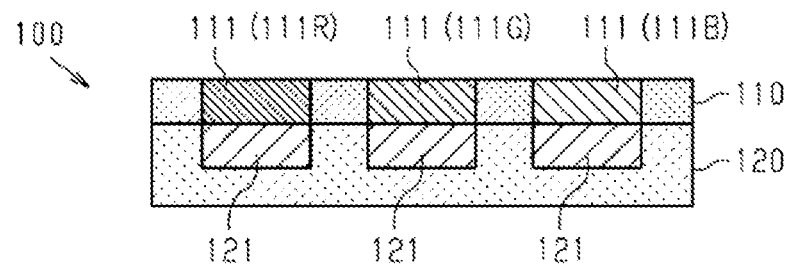
FIG. 15 is a diagram illustrating a cross-sectional structure of an optical device according to a fifth embodiment.

As shown in FIG. 15, an optical device 100 includes a filter layer 110 and a light receiving layer 120. The filter layer 110 includes a plurality of filter regions 111 that transmit light in different wavelength ranges. The filter regions 111 have a structure that causes a guided-mode resonance phenomenon. The filter regions 111 selectively reflect light in a specific wavelength range from among incident light by a guided-mode resonance phenomenon, and transmit light in a wavelength range other than the wavelength range of the reflected light.

FIG. 15 illustrates a configuration of the filter layer 110 in an example in which the optical device 100 is used for a photodetector, which is an image sensor that outputs color image data. In FIG. 15, the filter layer 110 includes a red reflection filter region 111R that reflects red light, a green reflection filter region 111G that reflects green light, and a blue reflection filter region 111B that reflects blue light. In the present embodiment, red light is light with an intensity peak in the wavelength range of 600 nm or more and 700 nm or less, green light is light with an intensity peak in the wavelength range of 520 nm or more and 580 nm or less, and blue light is light with an intensity peak in the wavelength range of 400 nm or more and 500 nm or less.

FIG. 15 illustrates only one filter region for each of the filter regions 111R, 111G, and 111B. However, the red reflection filter regions 111R, the green reflection filter regions 111G, and the blue reflection filter regions 111B are repeatedly positioned in a predetermined arrangement. Adjacent filter regions 111 may be in contact with each other, or a region may be provided between adjacent filter regions 111 to separate these filter regions.

The light receiving layer 120 includes a plurality of light receiving elements 121. The light receiving elements 121 are photoelectric conversion elements, and generate electric outputs corresponding to the intensity of light incident on the light receiving elements 121. The light receiving elements 121 may be embodied as, for example, photodiodes. The plurality of light receiving elements 121 have the same structure, that is, the same sensitivity and characteristics. The light receiving elements 121 may have sensitivity to the wavelength range of incident light to be detected. The plurality of light receiving elements 121 are arranged corresponding to respective filter regions 111R, 111G, and 111B, that is, each light receiving element 121 is disposed under a respective filter region 111.

In addition to the filter layer 110 and the light receiving layer 120, the photodetector may include, for example, an element for transfer or amplification of electric charge of the light receiving elements 121, a signal processing circuit, a wiring portion, and the like. Such an element and the like may be formed on the same substrate as that of the light receiving elements 121, or may be formed on a substrate different from that of the light receiving elements 121 and laminated on the light receiving layer 120. Further, a wiring portion, a film for flattening, shielding, or insulating, and the like may be disposed between the filter layer 110 and the light receiving layer 120.

Figure 16:
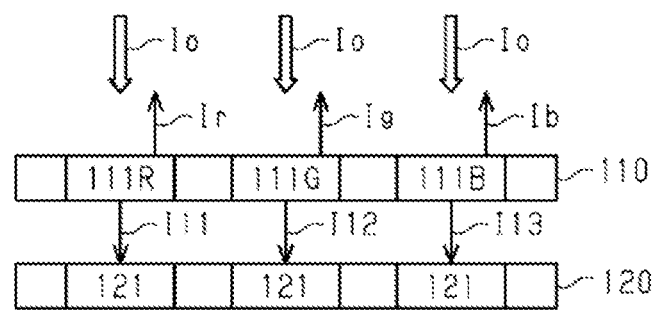
FIG. 16 is a diagram illustrating an effect of an optical device according to the fifth embodiment.

As shown in FIG. 16, incident light Io incident on the optical device 100 is incident on the filter layer 110. In the red reflection filter region 111R, light Ir in the red wavelength range is reflected, whereas light I11 in a wavelength range other than the red wavelength range from among the incident light Io passes through the red reflection filter region 111R and enters the light receiving element 121 under the red reflection filter region 111R. In the green reflection filter region 111G, light Ig in the green wavelength range is reflected, whereas light I12 in a wavelength range other than the green wavelength range from among the incident light Io passes through the green reflection filter region 111G and enters the light receiving element 121 under the green reflection filter region 111G. In the blue reflection filter region 111B, light Ib in the blue wavelength range is reflected, whereas light I13 in a wavelength range other than the blue wavelength range from among the incident light Io passes through the blue reflection filter region 111B and enters the light receiving element 121 under the blue reflection filter region 111B.

The wavelength range and intensity of the incident light Io are calculated by combining the output from the light receiving element 121 under the red reflection filter region 111R, the output from the light receiving element 121 under the green reflection filter region 111G, and the output from the light receiving element 121 under the blue reflection filter region 111B. For example, when the incident light Io is blue light, the output from the light receiving element 121 under the red reflection filter region 111R, and the output from the light receiving element 121 under the green reflection filter region 111G are substantially the same, and the output from the light receiving element 121 under the blue reflection filter region 111B is lowest. As described above, since the incident light Io includes a relatively large amount of light in the wavelength range reflected by the filter region 111 corresponding to the light receiving element 121 having a relatively low output, the wavelength range of the incident light Io can be calculated by comparing the outputs from the respective light receiving elements 121. Accordingly, the wavelength range of incident light from a unit region facing the red reflection filter region 111R, the green reflection filter region 111G, or the blue reflection filter region 111B can be detected, and thus a color of the unit region can be determined. The photodetector includes an arithmetic circuit that calculates the wavelength range of incident light by performing an arithmetic operation based on the outputs from the respective light receiving elements 121.

Figure 17:
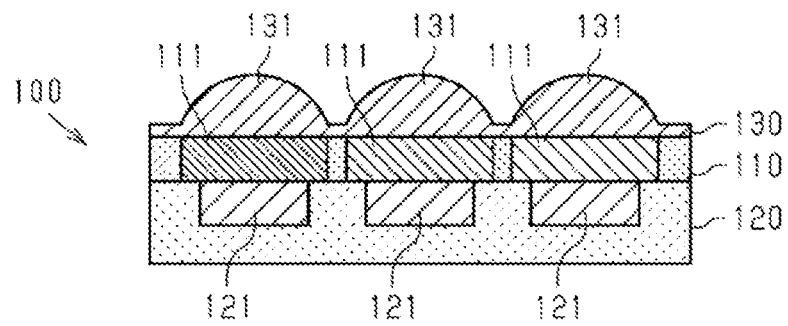
FIG. 17 is a diagram illustrating another example of a cross-sectional structure of an optical device according to the fifth embodiment.

As shown in FIG. 17, the optical device 100 may include a microlens array 130. The microlens array 130 is located above the filter layer 110. The microlens array 130 includes a plurality of microlenses 131. The plurality of microlenses 131 are arranged corresponding to respective filter regions 111R, 111G, and 111B, that is, each microlens 131 is disposed above a respective filter region 111. The microlens 131 converges the incident light toward the filter region 111 and the light receiving element 121. Due to the microlens 131 increasing the amount of light entering the light receiving element 121, the sensitivity in detection of light is increased.

The photodetector may be an image sensor such as a CCD image sensor or a CMOS image sensor, but is not limited thereto, and may also be a device for obtaining an optical spectrum of incident light. In short, the photodetector may be a device that separates and detects incident light to calculate the wavelength range and intensity of the incident light. The use of the calculation results is not limited. The wavelength range reflected by the filter region 111 may be set according to the use of the photodetector or the wavelength range of incident light to be detected. The number of filter regions 111 corresponding to the unit regions is not limited. The filter layer 110 may include two or more filter regions 111 having different reflection characteristics, that is, a plurality of filter regions 111 that reflect light in different wavelength ranges.

[Configuration of Filter Region]

A detailed configuration of the filter region 111 will be described below. The wavelength selective filter of the first to fourth embodiments and modifications thereof is applied to the filter region 111. The thickness direction of the filter region 111 is the first direction. Light is incident on the front surface of the filter region 111, that is, front surface of the wavelength selective filter.

As the materials of the substrate 11, the concavo-convex structure layer 21, the high refractive index layer 22, the low refractive index layer 23, and the embedded layer 24, materials that do not absorb a wavelength range of incident light to be detected is selected from the materials described in the first to fourth embodiments.

While a filter using a dye has a wide absorption band due to interaction between molecules, a filter using a guided-mode resonance phenomenon has a narrow wavelength selectivity determined by the refractive index of the material, the period of grating structure, and the like. Therefore, the wavelength selectivity of a filter using a guided-mode resonance phenomenon is higher than that of a filter using a dye. That is, light in a wavelength range other than that to be selected is prevented from being included in the transmitted light. For example, in a filter that transmits red light using a dye, light in a wavelength range of a color other than red may be included in the transmitted light to some extent. On the other hand, according to a filter using a guided-mode resonance phenomenon, light in a wavelength range for red is suitably prevented from being included in the transmitted light of the filter region 111R that reflects red light.

Therefore, the use of the filter region 111 using a guided-mode resonance phenomenon can increase the accuracy in selection of light in the optical device 100. As a result, the accuracy in wavelength detection by the photodetector can be increased.

Other examples of the filter using a structural color include a filter using plasmon resonance. However, a filter using a guided-mode resonance phenomenon has higher transmittance than a filter using plasmon resonance, and thus provides the optical device 100 with increased sensitivity.

In addition, a guided-mode resonance phenomenon is caused by light incident in a direction perpendicular to the filter region 111. Accordingly, oblique light from a position facing a filter region 111 adjacent to a target filter region 111 is prevented from affecting the target filter region 111. As a result, the accuracy in wavelength detection by the photodetector can be increased.

Further, in a configuration in which a concavo-convex structure on a surface of the low refractive index layer 23 is located on the outermost surface of the filter region 111, surface reflection of the filter region 111 can be reduced compared with a configuration in which the outermost surface of the filter region 111 is flat. As light is incident on a surface of the low refractive index layer 23, the intensity of light entering the filter region 111 increases, and thus the intensity of light entering the light receiving element 121 increases. Therefore, the accuracy of detection by the photodetector is increased.

The wavelength range of reflected light and transmitted light of the filter regions 111 can be adjusted using the period of subwavelength grating, the thicknesses T1 and T2 of the grating regions 13 and 15, and materials for the concavo-convex structure layer 21, the high refractive index layer 22, and the low refractive index layer 23. In particular, in a configuration in which only the period of subwavelength grating is changed to change the wavelength range of reflected light and transmitted light of the plurality of filter regions 111, the protrusions 21a provided with different periods are formed so that a plurality of filter regions 111 can be collectively produced in the same production process.

Specifically, each of the substrate 11, the first low refractive index region 12, the first grating region 13, the intermediate region 14, the second grating region 15, the second low refractive index region 16, and the top region 17 is continuous among the filter regions 111 adjacent to each other in the filter layer 110. That is, the filter regions 111 adjacent to each other have a single common substrate 11, the concavo-convex structure layer 21 continuous among these regions, the high refractive index layer 22 continuous among these regions, and the low refractive index layer 23 continuous among these regions.

The concavo-convex structure layers 21 for the filter regions 111 that reflect light in different wavelength ranges can be simultaneously formed by, for example, a nanoimprinting method using a glass mold having different periods of concavo-convex structure for the portions corresponding to the respective filter regions 111. Further, portions of the high refractive index layer 22 and the low refractive index layer 23 corresponding to the respective filter regions 111 can also be simultaneously formed. Accordingly, the filter layer 110 having a plurality of filter regions 111 can be easily formed.

It should be noted that a surface of the low refractive index layer 23 may be flat if a function of the top region 17, that is, a function of canceling light in a wavelength range other than that enhanced by the grating regions 13 and 15, and a function of suppressing surface reflection are not of importance.

FIG. 18 illustrates a filter region 111 having a structure in which a low refractive index layer 23 with a flat surface is applied to the wavelength selective filter 10 of the first embodiment. In this case, the filter region 111 does not include the top region 17, that is, a region corresponding to the concavo-convex structure on the surface of the low refractive index layer 23, and the surface of the second low refractive index region 16 is the outermost surface of the filter region 111. When the surface of the low refractive index layer 23 is flat, the low refractive index layer 23 can be formed of a resin material using various coating methods to easily produce the low refractive index layer 23. As the resin material, for example, the same material as that of the concavo-convex structure layer 21 is used.

For example, when a UV-curable resin is used as a low refractive index material for forming the low refractive index layer 23, a surface of the high refractive index layer 22 is first coated with the UV-curable resin. Then, a flat plate made of a material that transmits UV radiation is pressed against a surface of the coating layer made of the UV-curable resin, and UV radiation is applied to the coating layer. Subsequently, a cured UV-curable resin is removed from the flat plate. Thus, the low refractive index layer 23 having a flat surface is formed. When the low refractive index layer 23 having a flat surface is formed of a resin material, the thickness of the low refractive index layer 23 is preferably 100 nm or more and 20 μm or less.

When the concavo-convex structure layer 21 is formed using a thermoplastic resin, the low refractive index layer 23 is preferably formed using a material different from the thermoplastic resin to prevent deformation of the concavo-convex structure layer 21 due to heat applied during formation of the low refractive index layer 23. For example, the concavo-convex structure layer 21 may be formed of a thermoplastic resin, and the low refractive index layer 23 may be formed of a UV-curable resin.

When the filter region 111 does not have the top region 17, the filter region 111 may also be arranged so that light is incident on the second low refractive index region 16 via the substrate 11, that is, the second low refractive index region 16 faces the light receiving element 121.

In the configuration shown in FIG. 18, in which the low refractive index layer 23 has a flat surface, a simulation was performed for ratios (OT2/OT1) in optical film thickness between the first grating region 13 and the second grating region 15. The results will be described below.

FIGS. 19A, 19B, 19C, and 19D are reflection simulation spectra calculated using rigorous coupled-wave analysis (RCWA). The values of parameters described below are shown by rounding off the fourth decimal place.

In the simulation, light was incident in a direction from the second low refractive index region 16 toward the substrate 11 at an incidence angle of 0°. The grating order of the subwavelength grating was 1st, P1=P2=300 nm, R1=0.537, and R2=0.6. T2 is 70 nm, and the film thickness of the high refractive index material deposited on the side surface of the protrusions 21a of the concavo-convex structure layer 21, that is, the width of the intermediate high refractive index region 14a in the third direction was 14 nm.

Note that P1 is the period (first period) of the grating structure in the first grating region 13, and P2 is the period (second period) of the grating structure in the second grating region 15. R1 is the area ratio of the first grating high refractive index region 13a in the first grating region 13 as used in the formula (1) in the first embodiment, and R2 is the area ratio of the second grating high refractive index region 15a in the second grating region 15 as used in the formula (3) in the first embodiment. T1 is the thickness of the first grating region 13, and T2 is the thickness of the second grating region 15.

Figure 19A:
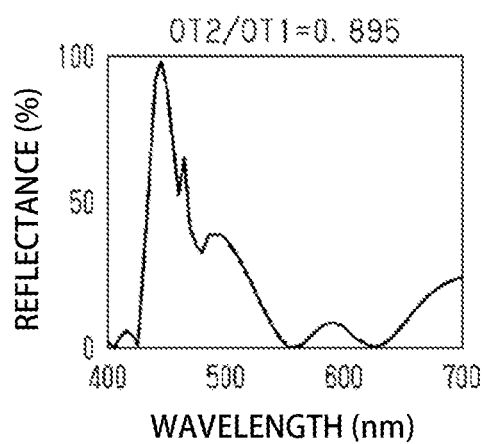
FIGS. 19A to 19D are simulation results for wavelength selectivity of a filter region, illustrating reflection simulation spectra using rigorous coupled-wave analysis.
Figure 19B:
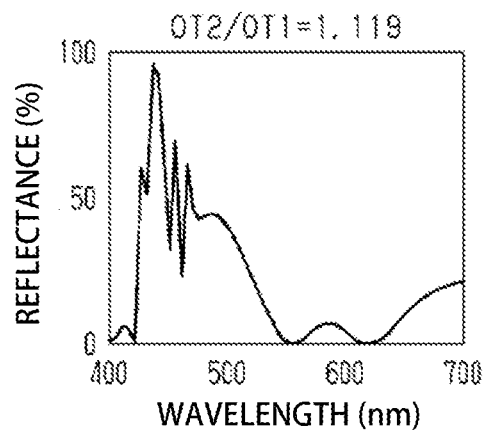
Figure 19C:
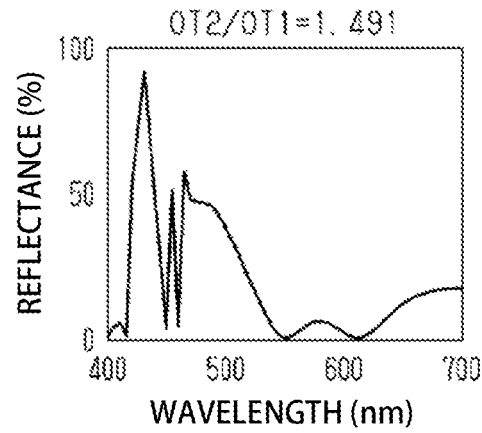
Figure 19D:
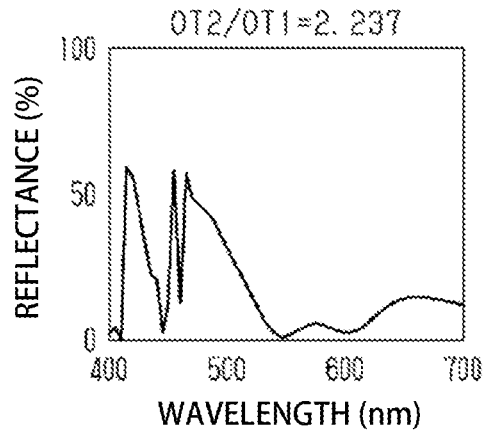

FIG. 19A is a spectrum in the case of T1=T2 (OT2/OT1=0.895), FIG. 19B is a spectrum in the case of T1=0.8× T2 (OT2/OT1=1.119), FIG. 19C is a spectrum in the case of T1=0.6×T2 (OT2/OT1=1.491), and FIG. 19D is a spectrum in the case of T1=0.4×T2 (OT2/OT1=2.237).

The refractive indices of respective layers used in the calculation at the wavelength of 420 nm are 1.683 in the substrate 11, 1.504 in the concavo-convex structure layer 21 and the low refractive index layer 23, and 2.620 in the high refractive index layer 22. Since the materials of all the layers have an extinction coefficient of 0, 100−reflectance=transmittance.

It was found from FIGS. 19A to 19D that, as the value of OT2/OT1 is further from 1, the reflection peak is split and the peak reflectance tends to decrease. Accordingly, it was found that, as the value of OT2/OT1 is further from 1, the wavelength selectivity tends to decrease.

While the peak reflectance is 90% or more in the spectra shown in FIGS. 19A to 19C, the peak reflectance is less than 60% in the spectrum shown in FIG. 19D in which OT2/OT1=2.237. That is, it was found that, when OT2/OT1 exceeds 2, the wavelength selectivity significantly decreases.

As seen from the above, the value of OT2/OT1 is preferably 0.5 or more and 2.0 or less for obtaining high wavelength selectivity. Further, the value of OT2/OT1 is preferably 0.625 or more and 1.6 or less for obtaining higher wavelength selectivity.

When the value of OT2/OT1 is 1.0, that is, when the optical film thickness OT1 and the optical film thickness OT2 coincide with each other, the wavelength range of light that undergoes resonance in the first grating region 13 and the wavelength range of light that undergoes resonance in the second grating region 15 coincide with each other, which particularly increases the wavelength selectivity. For example, when the thickness T1 of the first grating region 13 and the thickness T2 of the second grating region 15 are the same, and the refractive index n2 of the concavo-convex structure layer 21 and the refractive index n3 of the low refractive index layer 23 are the same, it is preferred that the area ratio R1 of the first grating high refractive index regions 13a and the area ratio R2 of the second grating high refractive index regions 15a coincide with each other, whereby the optical film thickness OT1 and the optical film thickness OT2 coincide with each other.

Figure 20:
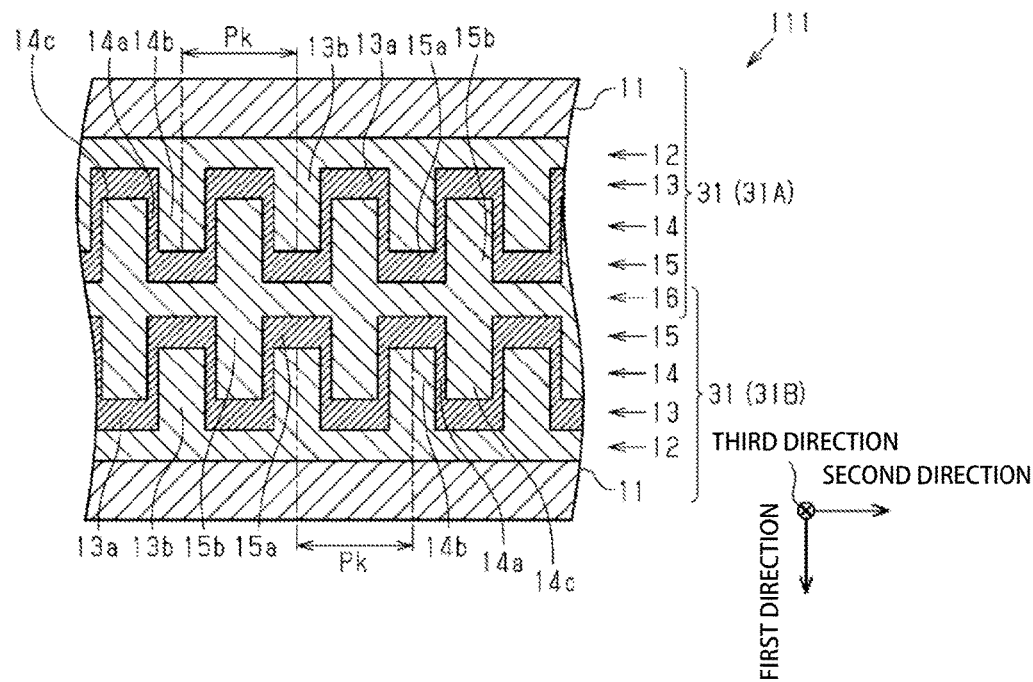
FIG. 20 is a diagram illustrating an example of a cross-sectional structure of a filter region according to the fifth embodiment.

FIG. 20 illustrates a filter region 111 having a structure in which the top region 17 is not provided in the wavelength selective filter 30 of the second embodiment. The resonance structure portion 31 of the filter region 111 is a structure including the first low refractive index region 12, the first grating region 13, the intermediate region 14, the second grating region 15, and the second low refractive index region 16. The first resonance structure portion 31A and the second resonance structure portion 31B may include a common low refractive index region at a boundary therebetween. For example, in the example shown in FIG. 20, the second low refractive index region 16 of the first resonance structure portion 31A and the second low refractive index region 16 of the second resonance structure portion 31B are continuous to each other, and no boundary is provided between these regions.

The above filter region 111 is formed by providing two structures, each including the substrate 11, the concavo-convex structure layer 21, and the high refractive index layer 22, with the respective high refractive index layers 22 facing each other, and joining these structures by filling a region between the structures with a low refractive index material. A portion formed by filling the low refractive index material between the two structures is the low refractive index layer 23. Various coating methods may be used to form the low refractive index layer 23.

Two resonance structure portions 31A and 31B may be disposed with the respective second low refractive index regions 16 facing outward, instead of facing each other. That is, the above two structures may be joined to each other via the low refractive index material with the respective substrates 11 facing each other.

Moreover, two resonance structure portions 31A and 31B may be disposed with the second low refractive index regions 16 of the resonance structure portions 31A and 31B being oriented in the same direction. That is, the above two structures may be joined to each other via the low refractive index material with the high refractive index layer 22 of one of the structures facing the substrate 11 of the other of the structures.

Figure 21:
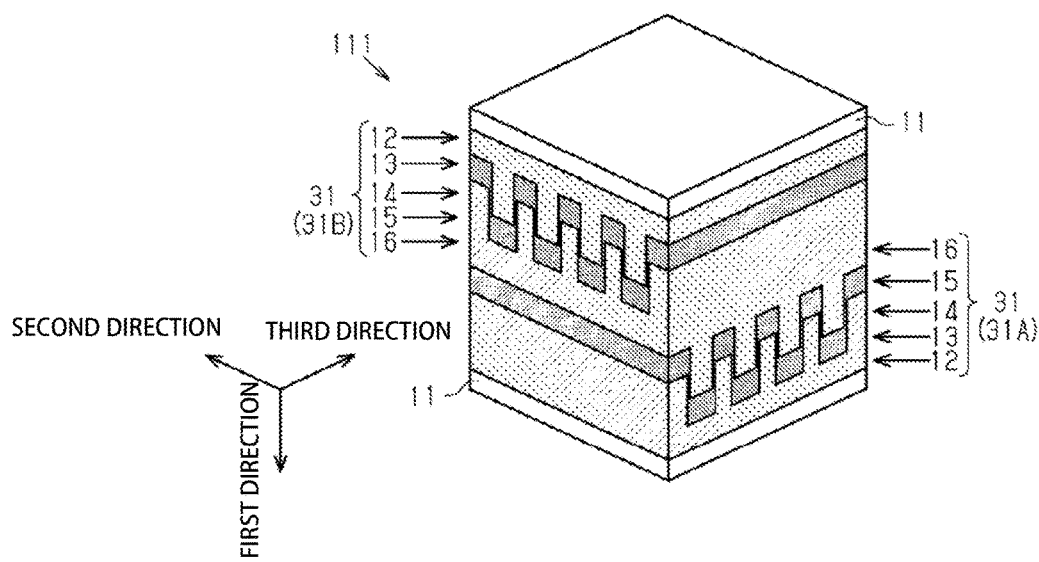
FIG. 21 is a diagram illustrating an example of a perspective structure of a filter region according to the fifth embodiment.

FIG. 21 illustrates a filter region 111 having a structure in which the top region 17 is not provided in the wavelength selective filter 40 of the third embodiment. In this configuration as well, the resonance structure portion 31 of the filter region 111 is a structure including the first low refractive index region 12, the first grating region 13, the intermediate region 14, the second grating region 15, and the second low refractive index region 16. The first resonance structure portion 31A and the second resonance structure portion 31B may include a common low refractive index region at a boundary therebetween. Two resonance structure portions 31A and 31B may be disposed with the respective second low refractive index regions 16 facing each other, facing outward, or being oriented in the same direction.

FIG. 22 illustrates a filter region 111 having a structure in which the top region 17 is not provided in the wavelength selective filter 50 of the fourth embodiment. In the filter region 111, the subwavelength grating has a two-dimensional grating pattern. The plurality of protrusions 21a may not necessarily be separated from each other. For example, the protrusions 21a may be in contact with each other at corners of the squares in plan view. In this case, the recess 21b is divided into a plurality of portions.

As described above, the polarization direction of light that undergoes resonance in the grating regions 13 and 15 depends on the arrangement direction of the subwavelength grating. When incident light polarized in a specific direction is a target, it is preferred that the subwavelength grating has an arrangement of one-dimensional grating pattern as in the first embodiment and the second embodiment, and the arrangement directions of all the subwavelength gratings included in the filter region 111 are aligned with each other. On the other hand, when incident light including polarization components in various directions is a target, it is preferred that the filter region 111 includes subwavelength gratings having different arrangement directions as in the third embodiment or that the subwavelength grating has a two-dimensional grating pattern as in the fourth embodiment.

According to the above fifth embodiment, the following advantageous effects can be obtained.

(14) Since the optical device 100 includes the filter layer 110 having the filter regions 111 using a guided-mode resonance phenomenon, the accuracy in selection of light in the optical device 100 can be increased.

(15) The filter region 111 includes the substrate 11, the concavo-convex structure layer 21, the high refractive index layer 22, and the low refractive index layer 23. Since the filter region 111 has a laminate structure of thin films, a structure in which the subwavelength grating is surrounded by a low refractive index material is suitably formed, and the filter region 111 can be easily formed.

(16) The filter region 111 includes the low refractive index layer 23 having a concavo-convex structure on a surface, and the surface of the low refractive index layer 23 is the outermost surface of the filter region 111. With this configuration, it is possible to reduce surface reflection, and prevent light in a wavelength range different from the reflected light enhanced by the above grating regions 13 and 15 from being emitted together with the reflected light due to reflection or interference in the filter region 111.

(17) In a configuration in which the subwavelength grating has a one-dimensional grating pattern, light polarized in a specific direction depending on the arrangement direction is reflected from the grating regions 13 and 15. Therefore, when the filter region 111 includes subwavelength gratings having arrangement directions aligned with each other, it is suitably used for a case where a target is incident light polarized in a constant direction. When the filter region 111 includes subwavelength gratings having arrangement directions different from each other, it is suitably used for a case where a target is incident light including polarization components into various directions.

(18) In a configuration in which the subwavelength grating has a two-dimensional grating pattern, light polarized in a different direction for each arrangement direction is reflected from the grating regions 13 and 15. Therefore, the above configuration is suitably used for a case where a target is incident light including polarization components into various directions.

(19) When the filter region 111 has a configuration in which a plurality of grating pairs composed of double layered subwavelength gratings having the same period and arrangement direction are provided, it is possible to improve the wavelength selectivity, and adjust polarization response, wavelength ranges of reflected light and transmitted light, and the like. For example, when the subwavelength grating has a one-dimensional grating pattern, and a plurality of grating pairs include subwavelength gratings having different arrangement directions, light polarized in a different direction for each grating pair is reflected as reflected light. Therefore, the above configuration is suitably used for a case where a target is incident light including polarization components into various directions.

(20) When the filter layer 110 includes the red reflection filter region 111R, the green reflection filter region 111G, and the blue reflection filter region 111B, the optical device 100 suitable for photodetectors such as image sensors targeting incident light in the visible region is obtained.

Modifications of Fifth Embodiment

In a configuration in which the subwavelength grating has a one-dimensional grating pattern, light polarized in a specific direction depending on the arrangement direction is emitted from the grating regions 13 and 15. By using this, the photodetector can calculate polarization direction of the incident light. That is, by comparing the outputs from the light receiving elements 121 corresponding to the filter regions 111 in which the subwavelength gratings have different arrangement directions, polarization components included in the incident light can be calculated. The filter layer 110 of the optical device 100 may include a plurality of filter regions 111 that reflect light in different wavelength ranges and/or a plurality of filter regions 111 in which the subwavelength gratings have arrangement directions different from each other, and the photodetector may be a device that detects at least one of the wavelength range and polarization direction of incident light.

SUPPLEMENTARY NOTES

The measure for solving the foregoing problems embraces the following items as technical ideas derived from the fifth embodiment and modifications thereof

[Item 1]

An optical device including: a filter layer including a plurality of filter regions that selectively reflect light; and a light receiving layer including a plurality of photoelectric conversion elements disposed corresponding to each of the filter regions, the photoelectric conversion elements being configured to receive transmitted light from the filter regions, wherein the filter regions have a structure in which grating structures having a subwavelength period are made of a high refractive index material and surrounded by a low refractive index material, and the plurality of filter regions include a plurality of the filter regions configured to reflect light in wavelength ranges different from each other and/or a plurality of the filter regions in which the grating structures have arrangement directions different from each other.

[Item 2]

The optical device according to the above item 1, wherein the filter regions include: a concavo-convex structure layer having a concavo-convex structure on a surface, the concavo-convex structure being composed of a plurality of concavo-convex elements arranged having a subwavelength period, the concavo-convex elements including protrusions and recesses; and a high refractive index layer located on the concavo-convex structure and having a surface shape following the concavo-convex structure, the high refractive index layer including a first grating high refractive index region located on a bottom of the concavo-convex structure to form a first grating structure, and a second grating high refractive index region located on a top of the concavo-convex structure to form a second grating structure.

[Item 3]

The optical device according to the above item 2, wherein the filter regions include a low refractive index layer located on the high refractive index layer and having a surface shape following a concavo-convex structure on a surface of the high refractive index layer.

[Item 4]

The optical device according to any one of the above items 1 to 3, wherein the grating structure has a one-dimensional grating pattern.

[Item 5]

The optical device according to any one of the above items 1 to 3, wherein the grating structure has a two-dimensional grating pattern.

[Item 6]

The optical device according to any one of the above items 1 to 3, wherein double layered grating structures having the same period and arrangement direction constitute a grating pair, and the filter regions include a plurality of the grating pairs arranged in a thickness direction of the filter layer.

[Item 7]

The optical device according to the above item 6, wherein the grating structure has a one-dimensional grating pattern, and the plurality of grating pairs include a plurality of the grating pairs in which the grating structures have arrangement directions different from each other.

[Item 8]

The optical device according to any one of the above items 1 to 7, wherein the plurality of filter regions include the filter region that reflects red light, the filter region that reflects green light, and the filter region that reflects blue light.

The best mode for implementing the present invention has been described with reference to the drawings. However, the scope of the present disclosure is not limited to the embodiments illustrated and described above, and may also include all the embodiments that provide effects equivalent to those intended by the present invention. Furthermore, the scope of the present disclosure is not limited to the features of the invention defined in the claims, and includes all the features disclosed herein and all the combinations of these features.

The terms "part," "element," "pixel," "cell," "segment," "unit," "display," and "product" as used herein refer to physical entities. The physical entities can refer to a physical form or a spatial form surrounded by a substance. The physical entities may be a structure. The structure may be one having a specific function. A combination of structures having a specific function can perform a synergistic effect due to a combination of the respective functions of the structures.

The terms used in the present disclosure and especially in the appended claims (for example, the text of the appended claims) are generally intended as "open" terms (for example, the term "has" should be interpreted as "at least has," and the term "includes" should be interpreted as "includes, but is not limited to," and the like).

In addition, in interpretation of terms, configurations, features, aspects, and embodiments, the drawings should be referred to as appropriate. Matters that can be directly and uniquely derived from the drawings, as well as the text, should be taken as grounds of correction.

Furthermore, when the claim recitation for introduction of a specific number is intended, such intention is expressly stated in the claims. Unless such a statement is provided, such intention does not exist. For example, in order to facilitate understanding, the following appended claims may include the use of introductory phrases "at least one" and "one or more" to introduce listing of claims. However, the use of such terms should not be construed as meaning that introducing the claim recitation by the indefinite article "a" or "an" limits a specific claim including the above claim to an embodiment which includes only one such recitation. The introductory phrase "one or more" or "at least one" and the indefinite article "a" or "an" (for example, "a" and/or "an") should be at least interpreted as meaning "at least" ("one" or "one or more"). The same applies to the use of definite articles used for introduction of claim recitation.

What is claimed is:

1. A wavelength selective filter, comprising:
a concavo-convex structure layer having a concavo-convex structure on a surface, the concavo-convex structure being composed of a plurality of concavo-convex elements arranged having a subwavelength period, the concavo-convex elements including protrusions and recesses;
a high refractive index layer located on the concavo-convex structure and having a surface shape following the concavo-convex structure, the high refractive index layer including a first grating high refractive index region located on a bottom of the concavo-convex structure to form a subwavelength grating, and a second grating high refractive index region located on a top of the concavo-convex structure to form a subwavelength grating; and
a low refractive index layer located on the high refractive index layer and having a surface shape following a concavo-convex structure on a surface of the high refractive index layer, wherein
the high refractive index layer has a refractive index higher than both of refractive indices of the concavo-convex structure layer and the low refractive index layer,
the concavo-convex structure layer, the high refractive index layer, and the low refractive index layer are made of a material transparent to light in a visible region,
the concavo-convex structure layer includes a UV-curable resin, a heat-curable resin, or a thermoplastic resin, and
the low refractive index layer includes an inorganic compound.

2. The wavelength selective filter of claim 1, wherein,
when a thickness of the first grating high refractive index region is T1, and a thickness of the second grating high refractive index region is T2,
a refractive index of the high refractive index layer is n1, a refractive index of the concavo-convex structure layer is n2, and a refractive index of the low refractive index layer is n3,
a ratio of area occupied by the first grating high refractive index region in a cross-section including the first grating high refractive index region and perpendicular to a thickness direction thereof is R1, and a ratio of area occupied by the second grating high refractive index region in a cross-section including the second grating high refractive index region and perpendicular to the thickness direction thereof is R2, and
n1>n2, n1>n3, and R1+R2>1,
a value obtained by T1×{n1×R1+n2×(1−R1)} is a first parameter, a value obtained by T2×{n1×R2+n3×(1−R2)} is a second parameter, and a ratio of the second parameter to the first parameter is 0.5 or more and 2.0 or less.

3. The wavelength selective filter of claim 2, wherein
the high refractive index layer includes an intermediate high refractive index region extending on a side surface of the concavo-convex elements between the first grating high refractive index region and the second grating high refractive index region, and,
when a ratio of area occupied by the intermediate high refractive index region in a cross-section including the intermediate high refractive index region and perpendicular to a thickness direction thereof is R3, R3≤R1+R2−1 is satisfied.

4. The wavelength selective filter of claim 1, wherein
a portion including the concavo-convex structure layer, the high refractive index layer, and the low refractive index layer is a resonance structure portion, and
the wavelength selective filter includes a plurality of the resonance structure portions arranged in a thickness direction of the resonance structure portion.

5. The wavelength selective filter of claim 4, wherein
the plurality of resonance structure portions include a first resonance structure portion and a second resonance structure portion, and
an arrangement period of the concavo-convex elements in the first resonance structure portion and an arrangement period of the concavo-convex elements in the second resonance structure portion coincide with each other.

6. The wavelength selective filter of claim 4, wherein
the plurality of resonance structure portions include a first resonance structure portion and a second resonance structure portion, and
an arrangement period of the concavo-convex elements in the first resonance structure portion and an arrangement period of the concavo-convex elements in the second resonance structure portion are different from each other.

7. The wavelength selective filter of claim 4, wherein
the plurality of resonance structure portions include a first resonance structure portion and a second resonance structure portion, and
an arrangement direction of the concavo-convex elements in the first resonance structure portion and an arrangement direction of the concavo-convex elements in the second resonance structure portion are different from each other.

8. A display comprising a display element, the display element being formed of the wavelength selective filter of claim 1.

9. An optical device, comprising:
a filter layer including a plurality of filter regions composed of the wavelength selective filter of claim 1; and
a light receiving layer including a plurality of photoelectric conversion elements disposed corresponding to each of the filter regions, the photoelectric conversion elements being configured to receive transmitted light from the filter regions, wherein
the plurality of filter regions include a plurality of the filter regions configured to reflect light in different wavelength ranges and/or a plurality of the filter regions in which the concavo-convex elements have arrangement directions different from each other.

10. A method of producing a wavelength selective filter, comprising the steps of:
forming a concavo-convex structure layer using a first low refractive index material, the concavo-convex structure layer having concavo-convex elements on a surface, the concavo-convex elements being composed of a plurality of protrusions and recesses arranged having a subwavelength period;
forming a high refractive index layer using a high refractive index material having a refractive index higher than that of the first low refractive index material, the high refractive index layer being formed on a surface of the concavo-convex structure layer, and including a first grating high refractive index region located on a bottom of the concavo-convex structure of the concavo-convex structure layer to form a subwavelength grating, and a second grating high refractive index region located on a top of the concavo-convex structure to form a subwavelength grating; and
forming a low refractive index layer using a second low refractive index material having a refractive index lower than that of the high refractive index material, the low refractive index layer being formed on a surface of the high refractive index layer, and having a surface shape following a concavo-convex structure on the surface of the high refractive index layer, wherein
the step of forming the concavo-convex structure layer includes forming the concavo-convex structure layer by pressing an intaglio plate against a coating layer containing a resin which is the first low refractive index material, and removing the intaglio plate after the resin is cured to transfer the concavo-convex structure of the intaglio plate to the resin;

the step of forming the high refractive index layer includes forming the high refractive index layer by physical vapor deposition, whereby the high refractive index layer includes an intermediate high refractive index region extending on a side surface of the concavo-convex element between the first grating high refractive index region and the second grating high refractive index region, and the second grating high refractive index region extends outside the intermediate high refractive index region when viewed in a direction parallel to a thickness direction of the high refractive index layer, and the step of forming the low refractive index layer includes forming the low refractive index layer by physical vapor deposition.

11. The method of producing a wavelength selective filter of claim 10, further comprising the step of:

forming an embedded layer by providing two concavo-convex structure bodies with the low refractive index layers facing each other, each of the concavo-convex structure bodies being a structure including the concavo-convex structure layer, the high refractive index layer, and the low refractive index layer, and filling a region between the two concavo-convex structure bodies with a third low refractive index material having a refractive index lower than that of the high refractive index material.

12. An optical device, comprising:

a filter layer including a plurality of filter regions composed of a wavelength selective filter and a light receiving layer including a plurality of photoelectric conversion elements disposed corresponding to each of the filter regions, the photoelectric conversion elements being configured to receive transmitted light from the filter regions, wherein the plurality of filter regions include a plurality of the filter regions configured to reflect light in different wavelength ranges and/or a plurality of the filter regions in which the concavo-convex elements have arrangement directions different from each other, wherein the wavelength selective filter, comprises:

a concavo-convex structure layer having a concavo-convex structure on a surface, the concavo-convex structure being composed of a plurality of concavo-convex elements arranged having a subwavelength period, the concavo-convex elements including protrusions and recesses;

a high refractive index layer located on the concavo-convex structure and having a surface shape following the concavo-convex structure, the high refractive index layer including a first grating high refractive index region located on a bottom of the concavo-convex structure to form a subwavelength grating, and a second grating high refractive index region located on a top of the concavo-convex structure to form a subwavelength grating; and a low refractive index layer located on the high refractive index layer and having a surface shape following a concavo-convex structure on a surface of the high refractive index layer, wherein the high refractive index layer has a refractive index higher than both of refractive indices of the concavo-convex structure layer and the low refractive index layer.

* * * * *